US012803268B2

(12) United States Patent
Robinson et al.

(10) Patent No.: US 12,803,268 B2
(45) Date of Patent: Nov. 17, 2026

(54) INTEGRATED CIRCUIT FOR CONTROLLING SWITCHABLE CURRENT PATHS

(71) Applicant: Cirrus Logic International Semiconductor Ltd., Edinburgh (GB)

(72) Inventors: Michael Robinson, Edinburgh (GB); Ross C. Morgan, Bathgate (GB); Graeam G. Mackay, Austin, TX (US); Neil Whyte, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 79 days.

(21) Appl. No.: 18/413,633

(22) Filed: Jan. 16, 2024

(65) Prior Publication Data

US 2024/0283237 A1 Aug. 22, 2024

Related U.S. Application Data

(60) Provisional application No. 63/602,802, filed on Nov. 27, 2023, provisional application No. 63/446,940, filed on Feb. 20, 2023.

(51) Int. Cl.
*H02H 3/24* (2006.01)
*G01R 31/327* (2006.01)
(Continued)

(52) U.S. Cl.
CPC ........... *H02H 3/24* (2013.01); *H03K 17/6871* (2013.01); *G01R 31/3277* (2013.01); *G01R 31/64* (2020.01)

(58) Field of Classification Search
CPC ........... H02H 3/24; H02H 1/043; H02H 7/16; H03K 17/6871; G01R 31/3277;
(Continued)

(56) References Cited

U.S. PATENT DOCUMENTS 4,686,426 A * 8/1987 Fujioka .................... G09G 3/30 345/208
6,005,366 A * 12/1999 Majumdar ........... H02M 7/538 318/811
(Continued)

FOREIGN PATENT DOCUMENTS

| | | | |
|---|---|---|---|
| CN | 115699500 | A | 2/2023 |
| EP | 4187748 | A | 5/2023 |
| WO | 2020253520 | A1 | 12/2020 |

OTHER PUBLICATIONS

Combined Search and Examination Report under Sections 17 and 18(3), UKIPO, Application No. GB2400644.7, dated Jan. 7, 2025.

*Primary Examiner* — Thienvu V Tran
*Assistant Examiner* — Muaamar Qahtan Al-Taweel
(74) *Attorney, Agent, or Firm* — Jackson Walker L.L.P.

(57) ABSTRACT

An integrated circuit (IC) comprising: control circuitry operable to control: an external switch of a primary current path for an energy storage component of a circuit, wherein the external switch of the primary current path is external to the IC; a first internal switch of a secondary current path for the energy storage element, wherein the first internal switch is internal to the IC, wherein the IC is operable in: a first mode in which the first internal switch of the secondary current path is actuated to enable the secondary current path; and a second mode in which the external switch of the primary current path is actuated to enable the primary current path.

27 Claims, 14 Drawing Sheets

(51) Int. Cl.
*G01R 31/64* (2020.01)
*H03K 17/687* (2006.01)

(58) Field of Classification Search
CPC .. G01R 31/64; H02M 1/0003; H02M 1/0032; H02M 1/08; H02M 1/32; H02M 3/156; H02M 3/1566
See application file for complete search history.

(56) References Cited

U.S. PATENT DOCUMENTS

| | | | | | |
|---|---|---|---|---|---|
| 7,166,992 | B2 * | 1/2007 | Kudo | H02M 3/1588 323/282 |
| 7,936,160 | B1 * | 5/2011 | Sheehan | H02M 3/156 323/288 |
| 7,977,920 | B2 * | 7/2011 | Pollak | H02M 3/156 320/140 |
| 8,054,054 | B2 * | 11/2011 | Lee | H03K 17/6871 363/60 |
| 8,717,001 | B2 | 5/2014 | Bernardon et al. | |
| 9,685,863 | B2 * | 6/2017 | Veeramreddi | H02M 3/158 |
| 9,692,296 | B1 * | 6/2017 | Dash | H02M 3/1588 |
| 10,320,290 | B2 * | 6/2019 | Peker | H02M 3/156 |
| 2001/0028571 | A1 * | 10/2001 | Hanada | H02H 9/001 363/50 |
| 2003/0090313 | A1 * | 5/2003 | Burgener | H03K 17/063 327/408 |
| 2005/0093512 | A1 * | 5/2005 | Mader | H01M 10/42 320/116 |
| 2007/0057655 | A1 * | 3/2007 | Nishida | H01M 10/44 323/282 |
| 2009/0040857 | A1 | 2/2009 | McNeil et al. | |
| 2010/0026250 | A1 * | 2/2010 | Petty | H02M 3/156 323/271 |
| 2010/0327836 | A1 * | 12/2010 | Li | H02M 3/1588 323/283 |
| 2018/0226817 | A1 * | 8/2018 | Heiling | H02J 7/68 |
| 2020/0127467 | A1 | 4/2020 | Li | |
| 2022/0209523 | A1 | 6/2022 | Su | |

* cited by examiner

INTEGRATED CIRCUIT FOR CONTROLLING SWITCHABLE CURRENT PATHS

FIELD OF THE INVENTION

The present disclosure relates to an integrated circuit for controlling switchable current paths for an energy storage component of a circuit.

BACKGROUND

Many electronic circuits use a combination of one or more switches and one or more energy storage components such as capacitors and inductors to transfer energy between different nodes of the circuit.

For example, power converter circuits (e.g. boost converters, buck converters and buck-boost converters) typically use one or more inductors, a switch network and an output capacitor to generate an output voltage from an input voltage, where the output voltage is different (higher in the case of boost converters, and lower in the case of buck converters) from the input voltage.

Similarly, rectifier circuits typically use a switch network and one or more capacitors to convert an AC input voltage to a DC output voltage, while inverter circuits typically use a switch network and one or more capacitors to convert a DC input voltage into an AC output voltage.

Charge pump circuits typically use one or more capacitors and a switch network to convert an input DC voltage into a higher or lower output DC voltage, while cell balancing circuits typically use one or more capacitors or inductors and a switch network to transfer energy between cells in a battery or battery pack, to balance or equalise the energy stored in the cells.

Such circuits are often implemented as integrated circuits (ICs) comprising the switch networks, coupled with discrete energy storage components which are provided externally of the IC (i.e. off-chip). In such circuits the energy storage components are used to store energy during switching operations. If such discrete components are not located directly adjacent to the IC, the efficient and safe routing of wires or traces to and from the off-chip component(s) can present challenges, such as a need for shielding or dedicated planes for large current devices and components in a substrate or carrier such as a printed circuit board (PCB) on which the IC and discrete components are mounted.

In addition, for systems that use relatively large capacitors or other energy storage components, the initial power-up of the system can lead to relatively large spikes in current, called inrush current. Effectively managing such inrush current to prevent damage due to heating or electromagnetic interference (EMI) effects can present further challenges. Additionally, the ability to isolate such large capacitors when the system is placed in a lower power mode of operation (e.g. a standby mode) can help prevent the loss of stored energy due to leakage of charge from the capacitor, thus improving the overall efficiency of the system.

SUMMARY

According to a first aspect, the invention provides an integrated circuit (IC) comprising: control circuitry operable to control: an external switch of a primary current path for an energy storage component of a circuit, wherein the external switch of the primary current path is external to the IC; a first internal switch of a secondary current path for the energy storage element, wherein the first internal switch is internal to the IC, wherein the IC is operable in: a first mode in which the first internal switch of the secondary current path is actuated to enable the secondary current path; and a second mode in which the external switch of the primary current path is actuated to enable the primary current path.

The first internal switch may be configured to have a higher on-resistance than the external switch.

The first internal switch may be physically smaller than the external switch.

An on-resistance of the first internal switch may be controllable.

The IC may further comprise a second internal switch of a tertiary current path for the energy storage element. The second internal switch may be internal to the IC.

The control circuitry may be configured to control the external switch and the first internal switch based on signal indicative of a voltage at an energy storage component coupling terminal of the IC.

The control circuitry may comprise comparator circuitry configured to compare the signal indicative of the voltage at the energy storage component coupling terminal to a signal indicative of a predefined threshold voltage and to selectively actuate the first internal switch and the external switch based on the comparison.

The control circuitry may be configured to actuate the external switch to enable the primary current path when the voltage at the energy storage component coupling terminal falls below the predefined threshold voltage.

The IC may further comprise fault detection configured to output a signal indicative of detection of a fault condition if the voltage at the energy storage component coupling terminal subsequently equals or exceeds the predefined threshold voltage.

The IC may further comprise fault detection circuitry configured to compare an actual charging or discharging profile of the energy storage component to an expected charging or discharging profile of the energy storage component to identify the existence of a fault condition.

The fault detection circuitry may be configured to output a signal indicative of detection of a fault condition if a time taken for a voltage at an energy storage component coupling terminal of the IC to reach a predefined threshold voltage does not correspond to an expected time for the voltage at the energy storage component coupling terminal to reach the predefined threshold voltage.

The IC may be configured to output a fault detection voltage to an energy storage component coupling terminal of the IC and to monitor a voltage at the energy storage component coupling terminal to detect a fault in the external switch.

The IC may comprise a fault detection voltage source and a fault detection switch configured to selectively couple the fault detection voltage source to the energy storage component coupling terminal.

The IC may be configured to compare the monitored voltage at the energy storage component coupling terminal to a fault detection voltage threshold voltage and to output a signal indicative of detection of a fault condition if the monitored voltage at the energy storage component coupling terminal is greater than a fault detection voltage threshold voltage.

The IC may comprise a comparator for comparing the monitored voltage at the energy storage component coupling terminal to the fault detection voltage threshold voltage.

The fault detection switch may comprise a MOSFET.

The IC may comprise a first output terminal and an energy storage component coupling terminal. In use of the IC, a first terminal of the energy storage component may be coupled to the first output terminal and a second terminal of the energy storage component may be coupled to the energy storage component coupling terminal and the external switch may be coupled between the second terminal of the energy storage component and an external reference voltage terminal; and the first internal switch may be coupled between an energy storage component coupling terminal of the IC and an internal reference voltage terminal of the IC, such that in use of the IC the first internal switch is coupled between the energy storage component and internal reference voltage terminal.

The second internal switch may be coupled between an energy storage component coupling terminal of the IC and an internal reference voltage terminal of the IC, such that in use of the IC the second internal switch is coupled between the energy storage component and internal reference voltage terminal.

The IC may further comprise: second control circuitry operable to control: a second external switch of a primary current path for a second energy storage component of a circuit, wherein the external switch of the primary current path for the second energy storage component is external to the IC; a third internal switch of a secondary current path for the second energy storage element, wherein the second internal switch is internal to the IC.

The IC may further comprise a fourth internal switch of a tertiary current path for the second energy storage element. The fourth internal switch may be internal to the IC.

The energy storage component may comprise a capacitor or an inductor, for example.

The IC may comprise: a power converter IC; a boost converter IC; a buck converter IC; a buck-boost converter IC; a charge pump IC; a rectifier IC; an inverter IC; or a cell balancing IC.

According to a second aspect the invention provides a module comprising: the integrated circuit of the first aspect; the external switch; and an energy storage component coupled to the integrated circuit and the external switch.

According to a third aspect the invention provides a host device comprising the integrated circuit of the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the invention will now be described, strictly by way of example only, with reference to the accompanying drawings, of which.

DETAILED DESCRIPTION

The present disclosure describes an integrated circuit (IC) for use with external (i.e. off-chip) energy storage components such as capacitors or inductors. The IC includes control circuitry for controlling an external (i.e. off-chip) switch that provides a primary current path for the energy storage component and an internal (i.e. on-chip) switch that provides a secondary current path, in parallel with the primary current path, for the energy storage component. The internal switch is configured to have a higher on-resistance than the external switch (e.g. the internal switch may be physically smaller than the external switch), such that the secondary current path is current-controlled, as compared to the primary current path. The IC is operable in a first mode in which the secondary current path through the internal switch is selected or enabled (and the primary current path is deselected or disabled), to limit the current flowing through the energy storage component. The first mode may be selected, for example, for use in an initial power-up phase of operation of a system incorporating the IC to control inrush current and/or to permit charging or discharging of the energy storage component. The IC is also operable in a second mode in which the primary current path through the external switch is selected or enabled (and the secondary current path is deselected or disabled). The second mode may be selected, for example, for use in normal steady-state operation of the system, to divert relatively high currents that may be present in such operation away from the IC, to prevent damage to the IC due to thermal or EMI effects.

Figure 1:
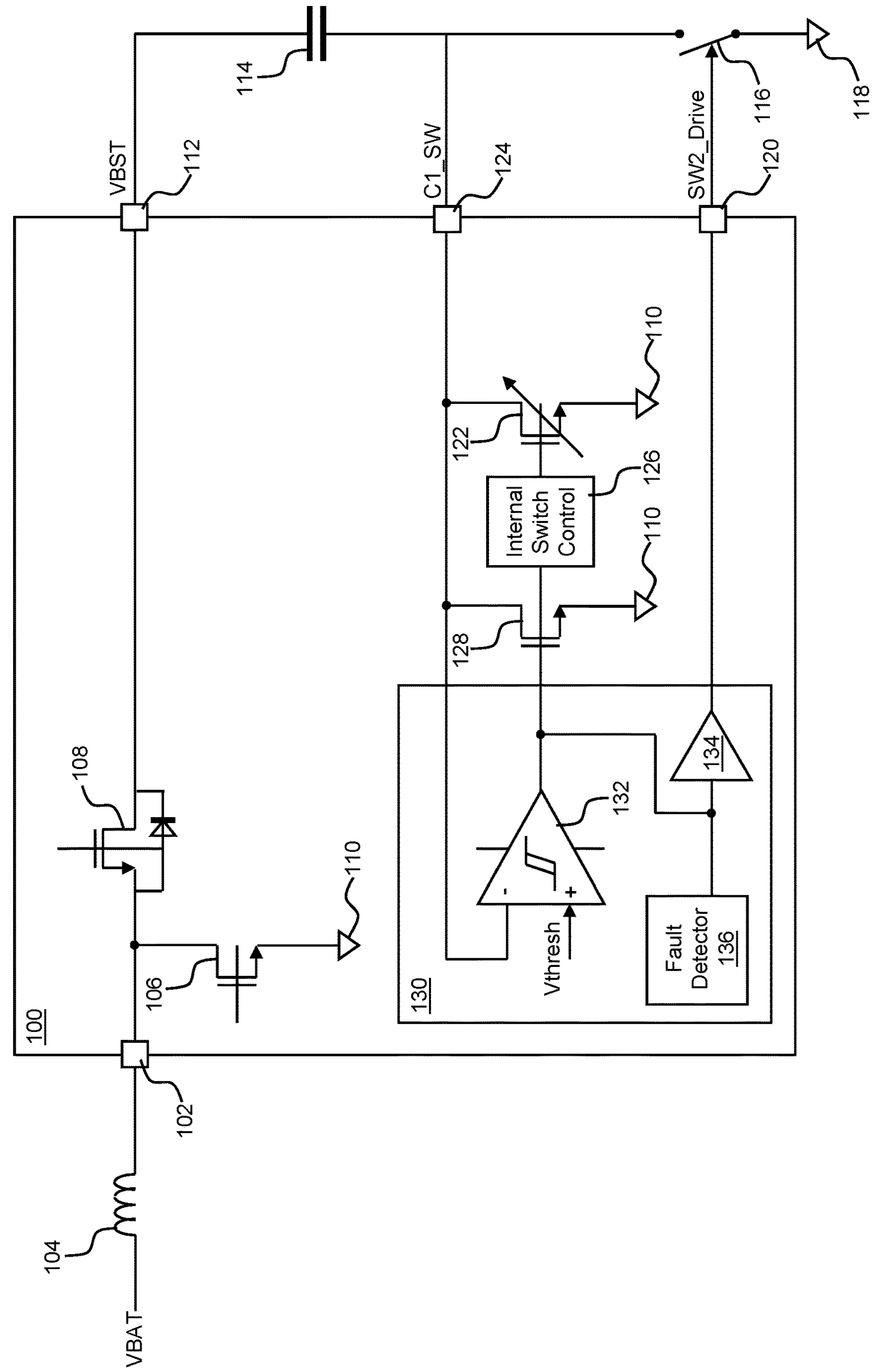
FIG. 1 is a schematic representation of an integrated circuit according to the present disclosure.

FIG. 1 is a schematic representation of an integrated circuit (IC) according to the present disclosure. In the example shown in FIG. 1, the IC 100 is configured as a power converter IC (specifically a boost converter IC), operative to receive an input voltage VBAT from a source such as a battery and to output an output voltage VBST of higher magnitude than the input voltage VBAT. It will be appreciated by those of ordinary skill in the art, however, that the principles of the present disclosure are equally applicable to ICs for other applications that involve controlled charging and/or discharging of energy storage components or devices that are external to the IC, e.g. buck converter ICs, buck-boost converter ICs, rectifier ICs, inverter ICs, charge pump ICs, cell balancing ICs and the like.

The IC 100 of FIG. 1 has a first input terminal 102 (e.g. a pin, pad, solder ball or the like) which, in use of the IC 100, is coupled to a first terminal of an inductor 104 which is provided externally of the IC 100 (e.g. on a printed circuit board or other carrier or substrate on which the IC 100 is mounted). The input voltage VBAT is supplied (by a source such as a battery of a host device incorporating the IC 100 and inductor 104) to a second terminal of the inductor 104.

The IC 100 includes a switch network comprising, in this example, first and second converter switches 106, 108, which are both internal to the IC 100. The first converter switch 106 is coupled between the first input terminal 102 and an internal ground (or other reference voltage) terminal 110 of the IC 100. The second converter switch 108 is coupled between the first input terminal 102 and a first output terminal 112 of the IC 100. The first and second converter switches 106, 108 are operable, under the control of suitable control circuitry (not shown), to alternately couple the first terminal of the external inductor 104 to the internal ground terminal 110 to store energy in the inductor 104 (i.e. to charge the inductor 104), and to couple the first terminal of the external inductor 104 to the first output terminal 112 to release energy from the inductor 104 (i.e. to discharge the inductor 104) in order to generate the output voltage VBST, in a manner that will be familiar to those of ordinary skill in the art.

The first output terminal 112 (which may be, for example, a pin, pad, solder ball or the like) is for supplying the output voltage VBST to downstream components, systems or subsystems. In use of the IC 100, the first output terminal 112 is coupled to a first terminal of a capacitor 114 which is provided externally of the IC 100 (e.g. on the printed circuit board or other carrier or substrate on which the IC 100 is mounted).

Although the capacitor 114 is shown in FIG. 1 as a single capacitor, in some examples the capacitor 114 may be implemented as a bank comprising a plurality of capacitors electrically coupled together in any suitable way to achieve a desired total capacitance. For example, the plurality of capacitors may be coupled in parallel (e.g. first, second and third capacitors coupled in parallel), in series (e.g. first, second and third capacitors coupled in series) or in a combination of series and parallel (e.g. a first capacitor coupled in parallel with a series combination of a second capacitor and a third capacitor). For clarity and simplicity, however, the present disclosure will refer to the capacitor 114, whether that capacitor is implemented as a single capacitor or as a bank of coupled capacitors.

An external switch 116 is coupled between a second terminal of the capacitor 114 and an external (i.e. external to the IC 100) ground (or other reference voltage) rail 118. The external switch 116 is a discrete device (e.g. a metal-oxide-semiconductor field-effect transistor or MOSFET or the like) that is external to the IC 100. A control terminal of the external switch 116 is coupled to a second output terminal 120 of the IC 100 so as to receive a switch control signal SW2_Drive from the IC 100.

The external switch 116 forms part of a primary current path for the capacitor 114, coupling the capacitor 114 to ground. (The primary current path also includes electrically conductive material such as a printed circuit board trace or track that electrically connects the second terminal of the capacitor 114 to the external switch 116, and electrically conductive material such as a printed circuit board trace or track that electrically connects the external switch 116 to the external ground rail 118).

The IC 100 further includes a first internal switch 122 (which may also be referred to as a "soft-ramp" switch) provided as a pull-down circuit. The first internal switch 122 is coupled between a capacitor coupling terminal 124 of the IC 100 (to which the second terminal of the capacitor 114 is coupled, in use of the IC 100) and the internal ground terminal 110 of the IC 100.

The first internal switch 122 is configured to have a higher on-resistance than the external switch 116. For example, the first internal switch 122 may be physically smaller than the external switch 116.

The first internal switch 122 may be, for example, a relatively weak switch or FET (field-effect transistor), and may have a programmable or controllable on-resistance. In examples where the first internal switch 122 has a programmable or controllable on-resistance, the IC 100 further includes internal switch control circuitry 126 for controlling the on-resistance of the first internal switch 122.

The first internal switch 122 forms part of a secondary current path, in parallel with the primary current path, for the capacitor 114, coupling the capacitor 114 to ground. (The secondary current path also includes electrically conductive material such as a printed circuit board trace or track that electrically connects the second terminal of the capacitor 114 to the capacitor coupling terminal 124, and electrically conductive material such as a lead wire within the IC 100 that connects the capacitor coupling terminal 124 to the first internal switch 122, and similar electrically conductive material within the IC 100 that connects the first internal switch 122 to the internal ground terminal 110).

As the on-resistance of the first internal switch 122 (whether fixed or programmable or controllable) is greater than that of the external switch, the secondary current path is current-limited, as compared to the primary current path.

In some examples, the IC 100 may further include a second internal switch 128 coupled in parallel with the first internal switch 122 between the capacitor coupling terminal 124 and the internal ground terminal 110. The second internal switch 128 may be, for example, a MOSFET device. In such examples, the second internal switch 128 and the first internal switch 122 may be implemented in a single device or as separate devices.

The second internal switch 128, where present, forms part of a tertiary current path, in parallel with the primary and secondary current paths, for the capacitor 114, coupling the capacitor 114 to ground. (The tertiary current path also includes electrically conductive material such as a printed circuit board trace or track that electrically connects the second terminal of the capacitor 114 to the capacitor coupling terminal 124, and electrically conductive material such as a lead wire within the IC 100 that connects the capacitor coupling terminal 124 to the second internal switch 128, and similar electrically conductive material within the IC 100 that connects the second internal switch 128 to the internal ground terminal 110).

The IC 100 further includes control circuitry 130 for controlling operation of the external switch 116, the first internal switch 122 and (if present) the second internal switch 128.

The control circuitry 130 in the illustrated example includes comparator circuitry 132 (which in this example is hysteretic comparator circuitry) and external switch control circuitry 134.

An inverting (−) input of the comparator circuitry 132 is coupled to the capacitor coupling terminal 124, so as to receive a voltage indicative of a voltage at the second terminal of the capacitor 114. A non-inverting (+) input of the comparator circuitry 132 receives a predefined threshold voltage Vthresh. Thus, the comparator circuitry 132 is operative to compare a voltage indicative of the voltage at the second terminal of the capacitor 114 to the predefined threshold voltage Vthresh.

An output of the comparator circuitry 132 is coupled to an input of the internal switch control circuitry 126. An output of the internal switch control circuitry 126 is coupled to a control terminal (e.g. a gate terminal) of the first internal switch 122. In examples that include the second internal switch 128, the output of the comparator circuitry 132 or the output of the internal switch control circuitry 126 may also be coupled to a control terminal (e.g. a gate terminal) of the second internal switch 128.

The output of the comparator circuitry 132 is also coupled to an input of the external switch control circuitry 134. An output of the external switch control circuitry 134 is coupled to the second output terminal 120 of the IC 100.

In operation of a system incorporating the IC 100, the secondary current path containing the first internal switch 122 may be selected or enabled (by actuating, e.g. switching on, the first internal switch 122) for use in an initial or power-up phase of operation of the system, during which initial charging (or discharging) of the external capacitor 114 is performed.

As noted above, the secondary current path is current-limited, as compared to the primary current path. By selecting the current-limited secondary current path for use in the initial or power-up phase of operation, inrush current can be controlled to prevent damage caused by thermal or EMI effects and the capacitor 114 can be charged or discharged without causing transient effects.

In examples in which the on-resistance of the first internal switch 122 is programmable or controllable, the on-resistance of the first internal switch 122 can be set to a desired level, to limit the current in the secondary current path to desired level, thus limiting inrush current during the initial or power-up phase.

Once the external capacitor 114 has charged to a predetermined level, the secondary current path is deselected or disabled (by de-actuating, e.g. switching off, the first internal switch 122), and the primary current path is selected or enabled for use during normal (e.g. steady-state) operation of the system, by actuating (e.g. switching on) the external switch 116. With the primary current path selected or enabled, relatively high currents that may flow during normal operation of the system flow through the external switch 116 rather than the first internal switch 122, and are thus kept away from the IC 100, which helps to avoid EMI, thermal or routing issues.

Thus, the IC 100 is selectively operable in a first mode and a second mode. In the first mode, the current-limited secondary current path is selected to couple the second terminal of the capacitor 114 to ground. In the second mode, the primary current path is selected to couple the second terminal of the capacitor 114 to ground.

The control circuitry 130 enables automatic switching between the first mode and the second mode.

As the capacitor 114 charges up during operation in the first mode, the voltage at the capacitor coupling terminal 124 falls. While the voltage at the capacitor coupling terminal 124 is higher than the predefined threshold voltage Vthresh, an output signal output by the comparator circuitry 132 is low.

In response to receiving a low output signal from the comparator circuitry 132, the internal switch control circuitry 126 actuates (e.g. switches on) the first internal switch 122, to enable or select the secondary current path.

The external switch control circuitry 134 also receives the output signal of the comparator circuitry 132. In response to receiving a low output signal from the comparator circuitry 132, the external switch control circuitry 134 outputs an external switch drive signal SW2_Drive to maintain the external switch 116 in a de-actuated (e.g. switched off) condition, thus disabling or deselecting the primary current path.

In examples of the IC 100 in which the on-resistance of the first internal switch 122 is programmable or controllable, the internal switch control circuitry 126 may also set the on-resistance of the first internal switch 122 to a desired level in response to a low output signal at the output of the comparator circuitry 132, to limit current in the secondary current path (e.g. inrush current) to a desired level.

In examples of the IC 100 that include the second internal switch 128, the internal switch control circuitry 126 may also de-actuate (e.g. switch off) the second internal switch 128 in response to a low output signal at the output of the comparator circuitry 132, thus disabling or deselecting the tertiary current path.

When the voltage at the capacitor coupling terminal 124 falls below the predefined threshold voltage Vthresh, the output signal output by the comparator circuitry 132 goes high. In response, the internal switch control circuitry 126 de-actuates (e.g. switches off) the first internal switch 122, thus disabling or deselecting the secondary current path.

In response to receiving a high output signal from the comparator circuitry 132, the external switch control circuitry 134 outputs an external switch drive signal SW2_Drive to actuate (e.g. switch on) the external switch 116, thus enabling or selecting the primary current path.

In examples of the IC 100 that include the second internal switch 128, the internal switch control circuitry 126 may actuate (e.g. switch on) the second internal switch 128 in response to a low output signal at the output of the comparator circuitry 132, thus enabling or selecting the tertiary current path.

The tertiary current path may be enabled or selected in this way in addition to enabling or selecting the primary current path, such that current flows through the capacitor 114 and both the external switch 116 and the second internal switch 128. Alternatively, the tertiary current path may be enabled or selected instead of the primary current path, such that current flows through the capacitor 114 and only the second internal switch 128. It will be appreciated by those of ordinary skill in the art that this alternative of enabling or selecting only the tertiary current path may be adopted if the IC 100 is configured in such a way as to accommodate the relatively high currents that flow during normal operation of a system incorporating the IC 100, e.g. if the second internal switch 128 is on a power plane.

In some examples, the IC 100 may also include fault detector circuitry 136 (e.g. as part of the control circuitry 130) configured to detect a fault in the external switch 116 and/or the external capacitor 114. An input of the fault detector circuitry 136 may be coupled to the output of the comparator circuitry 132, for example.

In one example, a "stuck open" fault in the external switch 116 (i.e. where the external switch 116 cannot close or switch on) can be detected based on the voltage at the capacitor coupling terminal 124.

If the external switch 116 cannot close, the voltage at the second terminal of the capacitor 114 will increase due to leakage from the capacitor 114, which will also cause the voltage at the capacitor coupling terminal 124 to increase. If the voltage at the capacitor coupling terminal 124 exceeds the predefined threshold voltage Vthresh, the output of the comparator circuitry 132 will go low. In such circumstances the fault detector circuitry 136 may output a signal indicative of detection of a fault in the external switch 116 in response to receiving a low output signal from the comparator circuitry 132. To avoid false positives, the fault detector circuitry 136 may be configured only to output the signal indicative of detection of a fault in the switch 116 if a low output signal is received from the comparator circuitry 132 within a predetermined period after a high output signal has been received from the comparator circuitry 132. As noted above, a high output signal from the comparator circuitry 132 should cause the external switch control circuitry 134 to output an external switch drive signal SW2_Drive to actuate the external switch 116. Thus, if a low output signal is received from the comparator circuitry 132 before a predetermined "timeout" period has elapsed after the external switch 116 should have been actuated as a result of a high output signal of the comparator circuitry 132, this may be indicative of a fault in the switch 116.

Additionally or alternatively, the fault detector circuitry 136 may be configured to compare an actual charging (or discharging) profile of the capacitor 114 (e.g. a time taken for the capacitor 114 to charge or discharge to a predefined level, as indicated by the voltage at the capacitor coupling terminal 124) to an expected charging profile of the capacitor 114 to determine whether a fault condition exists. If there is a difference between the expected charging profile and the actual charging profile, this may be indicative of a fault, and the fault detector circuitry 136 can output a signal indicative of detection of a fault condition.

For example, if the time taken for the voltage at the capacitor coupling terminal 124 to reach the threshold voltage Vthresh does not correspond to (e.g. is less than) an expected time for the voltage at the capacitor coupling terminal 124 to reach the threshold voltage Vthresh, as defined, for example, by the expected charging profile, this may be indicative of a fault such as a short circuit in the capacitor 114.

Thus, the fault detector circuitry 136 may receive the output signal of the comparator circuitry 132, and compare it to an output of timer circuitry, counter circuitry or the like. If the output signal of the comparator circuitry 132 goes high before a predetermined time period has elapsed (e.g. before the output of the timer circuitry, counter circuitry or the like of the fault detector circuitry 136 has reached a predetermined level), the fault detector circuitry 136 may output the signal indicative of detection of a fault in the capacitor 114.

Those skilled in the art will readily appreciate that alternative or additional approaches to detecting faults may be implemented by the fault detector circuitry 136.

In the example described above with reference to FIG. 1, the external switch 116 and the first and second internal switches 122, 128 are low-side switches (i.e. they are coupled on the low side of the capacitor 114, between the second terminal of the capacitor 114 and ground). In other examples, the external switch 116 and the first and second internal switches 122, 128 may be high-side switches, coupled to the first terminal of the capacitor 114.

Figure 2:
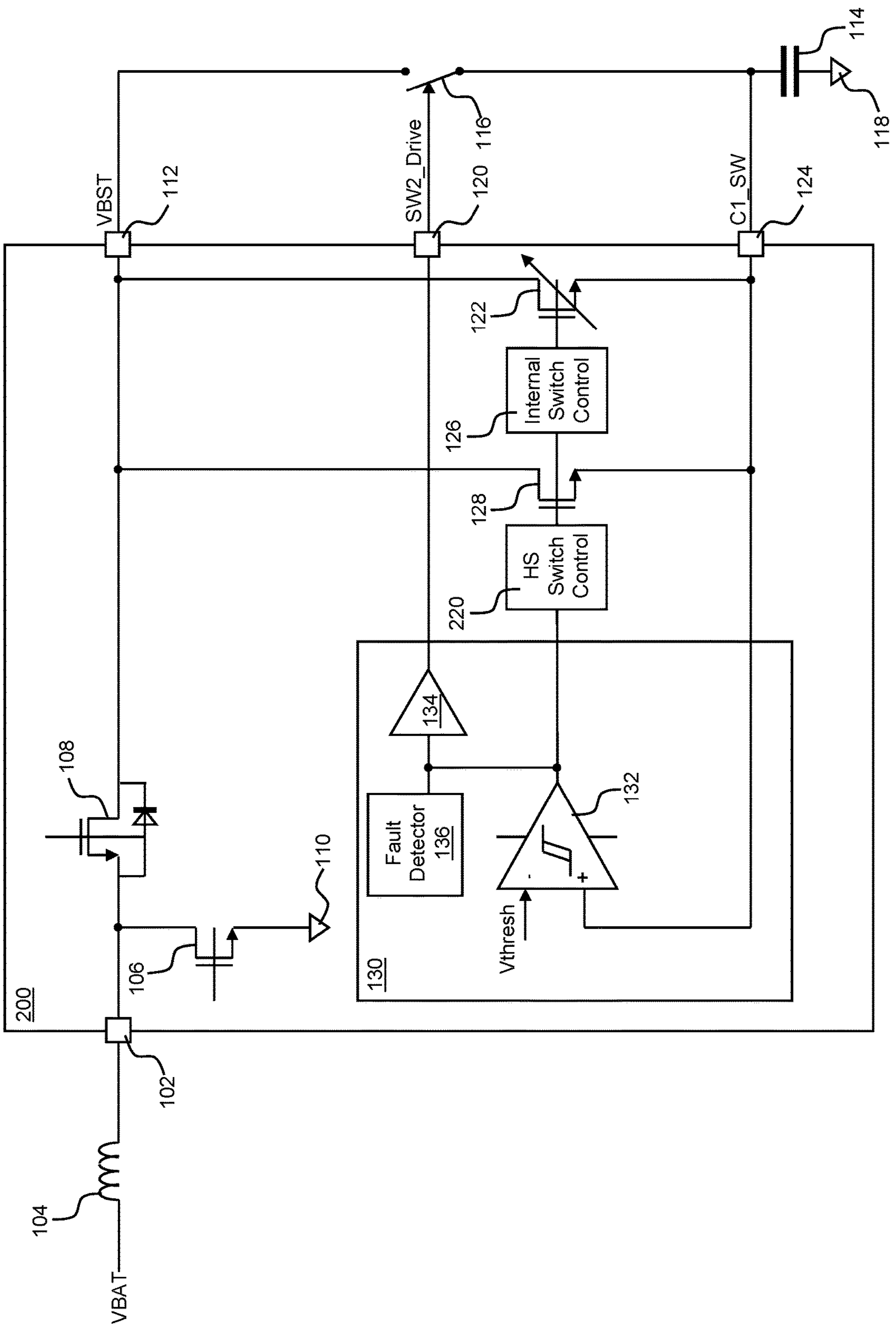
FIG. 2 is a schematic representation of an alternative integrated circuit according to the present disclosure.

FIG. 2 is a schematic representation of an alternative example integrated circuit (IC) according to the present disclosure. The IC 200 of FIG. 2 has many features in common with the IC 100 of FIG. 1. Such common features are denoted by common reference numerals in FIGS. 1 and 2, and will not be described again in detail here, for reasons of clarity and brevity.

The IC 200 differs from the IC 100 in that the external switch 116 is coupled, externally of the IC 200, between the first output terminal 112 of the IC 200 and the first terminal of the capacitor 114, with the second terminal of the capacitor 114 being directly electrically coupled to the external ground rail 118. The IC 200 further differs from the IC 100 in that the first internal switch 122 and the second internal switch 128 (if provided) are coupled, internally of the IC, between the first output terminal 112 and the capacitor coupling terminal 124.

Additionally, in use of the IC 200, the first terminal of the capacitor 114 is coupled to the capacitor coupling terminal 124 (rather than the second terminal of the capacitor 114, as in the IC 100). The non-inverting (+) input of the comparator circuitry 132 is coupled to the capacitor coupling terminal 124, to receive a voltage indicative of a voltage at the first terminal of the capacitor 114. The inverting (−) input of the comparator circuitry 132 receives the predefined threshold voltage Vthresh. The comparator circuitry 132 of the IC 200 is therefore operative to compare a voltage indicative of the voltage at the first terminal of the capacitor 114 to the predefined threshold voltage Vthresh.

While the voltage at the first terminal of the capacitor 114 is lower than predefined threshold voltage Vthresh, the output of the comparator circuitry 132 is low, and the internal switch control circuitry 126 actuates (e.g. switches on) the first switch 122, to enable or select the secondary current path.

When the voltage at the first terminal of the capacitor 114 reaches the predefined threshold voltage Vthresh, the output of the comparator circuitry 132 goes high. In response, the internal switch control circuitry 126 de-actuates (e.g. switches off) the first internal switch 122, thus disabling or deselecting the secondary current path.

Thus, in the IC 200 of FIG. 2, the first and second internal switches 122, 128 are high-side switches which, in use of the IC 200, are coupled to the first terminal of the capacitor 114. Similarly, the external switch 116 is a high-side switch.

As will be appreciated by those skilled in the art, control of a high-side MOSFET switch is more complex than control of a low-side MOSFET switch of the same type, because in a high-side switch arrangement the gate drive signal that drives the gate terminal is not referenced to ground. Thus, in order to achieve the gate-source voltage required to drive the switch to switch on correctly, the voltage at the gate must be higher than would be required in a low-side switch arrangement. Thus, high-side switch arrangements typically require additional circuitry such as charge pump circuitry to generate the required voltage for the gate drive signal.

To this end, the example IC 200 of FIG. 2 further differs from the IC 100 of FIG. 1 in that it includes high-side switch control circuitry 220 operative to generate a gate drive signal at a voltage required for correct control and operation of the first internal switch 122 and the second internal switch 128 (if present). The external switch control circuitry 134 of the IC 200 may also include similar circuitry operative to generate the external switch control signal SW2_Drive at a voltage required for correct control and operation of the external switch 116.

The IC 200 operates the same way as the IC 100 as described above, with the secondary current path containing the first internal switch 122 being selected or enabled in a first mode of operation for use in an initial or power-up phase of operation during which initial charging (or discharging) of the external capacitor 114 is performed, and the primary and/or tertiary current path being selected or enabled in a second mode of operation for normal operation of the IC 200.

As in the IC 100 of FIG. 1, the use of the secondary, current limited, current path containing the first internal switch 122 in the first mode of operation allows inrush current to be controlled to prevent damage or other problems that may arise due to thermal and/or EMI effects, while the use of the primary current path containing the external switch 116 in the second mode of operation keeps the relatively high currents that may be present during normal operation away from the IC 200. The tertiary current path containing the second internal switch 128 provides an additional or alternative current path for use in the second mode of operation, if the IC 200 is configured to accommodate the relatively high currents that may be present during normal operation, e.g. if the second internal switch 128 is on a power plane.

In some applications, an IC may be required to supply the output voltage VBST to a plurality of downstream components, systems or subsystems, each having its own external capacitor. For example, a boost converter IC may be required to supply the output voltage to a plurality of downstream amplifier circuits or subsystems, each of which is associated with its own capacitor. Additionally or alternatively, a downstream component, system or subsystem that receives the output voltage VBST from the IC may have a plurality of capacitors disposed at different locations on a PCB or other substrate or carrier on which the IC and the downstream component, system or subsystem is mounted, e.g. a first capacitor located close to the IC and a second capacitor located close to the downstream component, system or subsystem. In such applications the IC may be required to sense the voltage at the second terminal of each external capacitor, and may, additionally or alternatively, be required to control an external switch of a current path containing each external capacitor.

Figure 3:
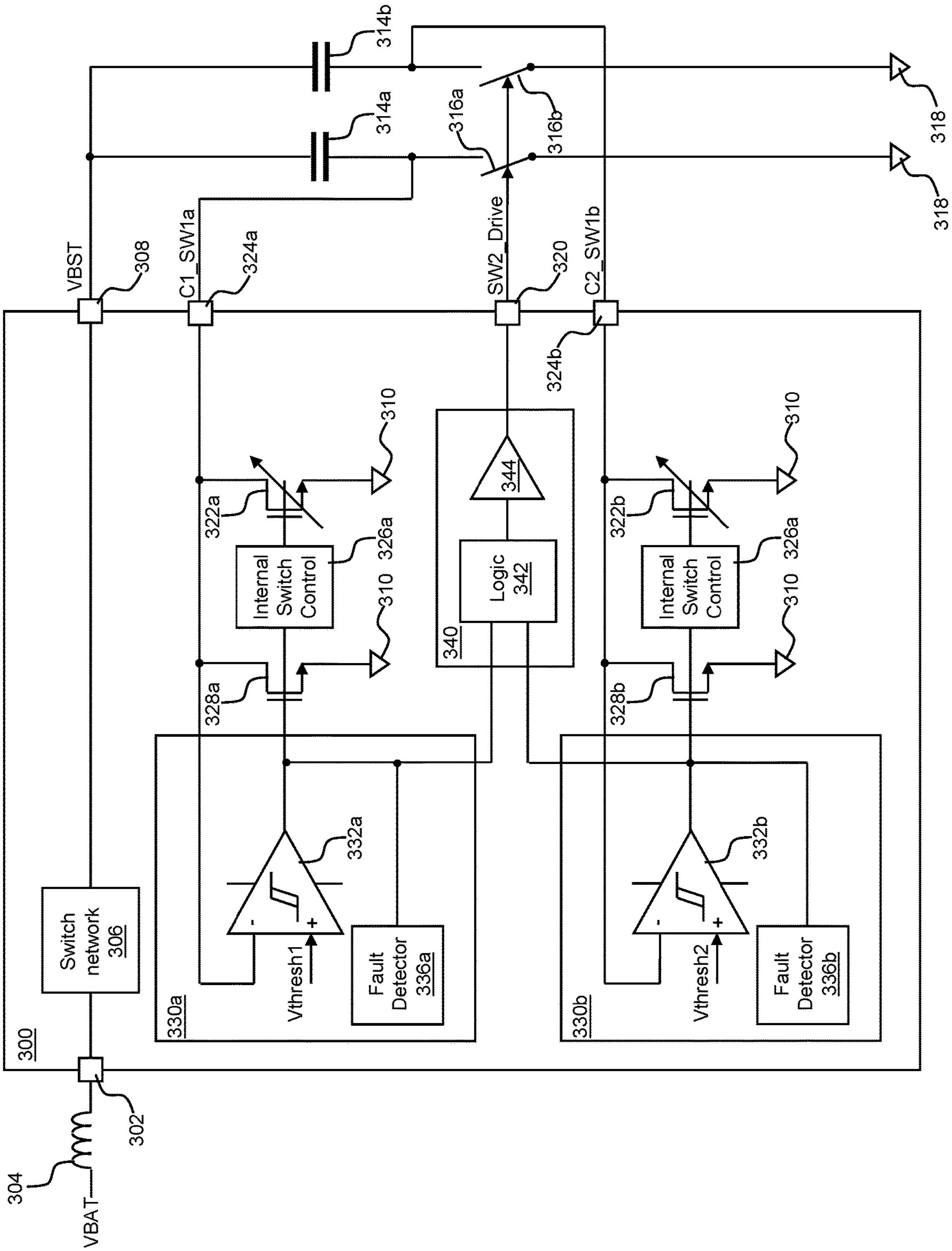
FIG. 3 is a schematic representation of a further alternative integrated circuit according to the present disclosure.

FIG. 3 is a schematic representation of an integrated circuit (IC) according to the present disclosure for use in such applications.

In the example shown in FIG. 3, the IC 300 is configured as a power converter IC (specifically a boost converter IC), operative to receive an input voltage VBAT from a source such as a battery and to output an output voltage VBST of higher magnitude than the input voltage VBAT.

The IC 300 of FIG. 3 has a first input terminal 302 (e.g. a pin, pad, solder ball or the like) which, in use of the IC 300, is coupled to a first terminal of an inductor 304 which is provided externally of the IC 300 (e.g. on a printed circuit board or other carrier or substrate on which the IC 300 is mounted). The input voltage VBAT is supplied (by a source such as a battery of a host device incorporating the IC 300 and inductor 304) to a second terminal of the inductor 304.

The IC 300 includes a switch network 306 which may comprise, for example, first and second converter switches (not shown) coupled in the same way as the first and second converter switches 106, 108 of the IC 100 of FIG. 1 to the first input terminal 302, an internal ground terminal 310 of the IC 300 and a first output terminal 308 of the IC 300, and operable in the manner described above with reference to FIG. 1 to generate the output voltage VBST.

In use of the IC 300, the first output terminal 308 is coupled to a first terminal of a first capacitor 314*a* and to a first terminal of a second capacitor 314*b*. The first and second capacitors 314*a*, 314*b* are both provided externally of the IC 300 (e.g. on the printed circuit board or other carrier or substrate on which the IC 300 is mounted).

As in the example described above with reference to FIG. 1, although the first and second capacitors 314*a*, 314*b* are shown in FIG. 3 as single capacitors, in some examples the first and second capacitors 314*a*, 314*b* may each be implemented as a bank comprising a plurality of capacitors electrically coupled together in any suitable way to achieve a desired total capacitance. For example, the plurality of capacitors may be coupled in parallel (e.g. first, second and third capacitors coupled in parallel), in series (e.g. first, second and third capacitors coupled in series) or in a combination of series and parallel (e.g. a first capacitor coupled in parallel with a series combination of a second capacitor and a third capacitor). For clarity and simplicity, however, the present disclosure will refer to the first and second capacitors 314*a*, 314*b*, whether those capacitors are implemented as single capacitors or as banks of coupled capacitors.

A first external switch 316*a* is coupled between a second terminal of the first capacitor 314*a* and an external (i.e. external to the IC 300) ground (or other reference voltage) rail 318. Similarly, a second external switch 316*b* is coupled between a second terminal of the second capacitor 314*b* and the external ground rail 318. The first and second external switches 316*a*, 316*b* are discrete devices (e.g. MOSFETs or the like) that are external to the IC 300. A control terminal of each of the first and second external switches 316*a*, 316*b* is coupled to a second output terminal 320 of the IC 300 so as to receive a common switch control signal SW2_Drive from the IC 300.

The first external switch 316*a* forms part of a primary current path for the first capacitor 314*a*, coupling the first capacitor 314*a* to ground. The second external switch 316*b* similarly forms part of a primary current path for the second capacitor 314*b*, coupling the second capacitor 314*b* to ground. (These primary current paths also include electrically conductive material such as a printed circuit board trace or track that electrically connects the respective second terminals of the first and second capacitor 314*a*, 314*b* to the first and second external switches 316*a*, 316*b*, and electrically conductive material such as a printed circuit board trace or track that electrically connects the first and second external switches 316*a*, 316*b* to the external ground rail 318).

The IC 300 further includes a first internal switch 322*a*, and may also include a second internal switch 338*a*. The first internal switch 322*a* (which may also be referred to as a first soft-ramp switch) is coupled between a first capacitor coupling terminal 324*a* of the IC 300 (to which the second terminal of the first external capacitor 314*a* is coupled, in use of the IC 300). The second internal switch 338*a* (if present) is coupled in parallel with the first internal switch 322*a* between the first capacitor coupling terminal 324*a* and the internal ground terminal 310. The second internal switch 328*a* and the first internal switch 322*a* may be implemented in a single device or as separate devices.

The first internal switch 322*a* is configured to have a higher on-resistance than the first external switch 316*a*. For example, the first internal switch 322*a* may be physically smaller than the first external switch 316*a*.

The first internal switch 322*a* may be, for example, a relatively weak switch or FET (field effect transistor), and may have a programmable or controllable on-resistance. In examples where the first internal switch 322*a* has a programmable or controllable on-resistance, the IC 300 further includes first internal switch control circuitry 326*a* for controlling the on-resistance of the first internal switch 322*a*.

The first internal switch 322*a* forms part of a secondary current path, in parallel with the primary current path, for the first capacitor 314*a*, coupling the first capacitor 314*a* to ground. (The secondary current path for the first capacitor 314*a* also includes electrically conductive material such as a printed circuit board trace or track that electrically connects the second terminal of the first capacitor 314*a* to the first capacitor coupling terminal 324*a*, and electrically conductive material such as a lead wire within the IC 300 that connects the first capacitor coupling terminal 324*a* to the first internal switch 322*a*, and similar electrically conductive material within the IC 300 that connects the first internal switch 322*a* to the internal ground terminal 310).

As the on-resistance of the first internal switch 322*a* (whether fixed or programmable or controllable) is greater than that of the first external switch 316*a*, the secondary current path for the first capacitor 314*a* is current-limited, as compared to the primary current path for the first capacitor 314*a*.

The second internal switch 328*a*, where present, forms part of a tertiary current path, in parallel with the primary and secondary current paths, for the first capacitor 314*a*, coupling the first capacitor 314*a* to ground. (The tertiary current path also includes electrically conductive material such as a printed circuit board trace or track that electrically connects the second terminal of the first capacitor 314*a* to the first capacitor coupling terminal 324*a*, and electrically conductive material such as a lead wire within the IC 300 that connects the first capacitor coupling terminal 324*a* to the second internal switch 328*a*, and similar electrically conductive material within the IC 300 that connects the second internal switch 328*a* to the internal ground terminal 310).

The IC 300 further includes first control circuitry 330*a* for controlling operation of the first internal switch 322*a* and (if present) the second internal switch 328*a*. The IC 300 further includes external switch control circuitry 340 for controlling operation of the first and second external switches 316*a*, 316*b*, which will be described in more detail below.

The first control circuitry 330*a* in the illustrated example includes first comparator circuitry 332*a*, which in this example is hysteretic comparator circuitry. An inverting (−) input of the first comparator circuitry 332*a* is coupled to the first capacitor coupling terminal 324*a*, so as to receive a voltage indicative of a voltage at the second terminal of the first capacitor 314*a*. A non-inverting (+) input of the first comparator circuitry 332*a* receives a first predefined threshold voltage Vthresh1. Thus, the first comparator circuitry 332*a* is operative to compare a voltage indicative of the voltage at the second terminal of the first capacitor 314*a* to the first predefined threshold voltage Vthresh1.

An output of the first comparator circuitry 332*a* is coupled to an input of the first internal switch control circuitry 326*a*. An output of the first internal switch control circuitry 326*a* is coupled to a control terminal (e.g. a gate terminal) of the first internal switch 322*a*. In examples that include the second internal switch 328*a*, the output of the first comparator circuitry 332*a* or the output of the first internal switch control circuitry 326*a* may also be coupled to a control terminal (e.g. a gate terminal) of the second internal switch 328*a*.

The output of the first comparator circuitry 332*a* is also coupled to an input of the external switch control circuitry 340. An output of the external switch control circuitry 340 is coupled to the second output terminal 320 of the IC 300.

The IC 300 further includes a third internal switch 322*b*, and may also include a fourth internal switch 338*b*. The third internal switch 322*b* (which may also be referred to as a second soft-ramp switch) is coupled between a second capacitor coupling terminal 324*b* of the IC 300 (to which the second terminal of the second external capacitor 314*b* is coupled, in use of the IC 300. The fourth internal switch 338*b* (if present) is coupled in parallel with the third internal switch 322*b* between the second capacitor coupling terminal 324*b* and the internal ground terminal 310. The fourth internal switch 328*b* and the third internal switch 322*b* may be implemented in a single device or as separate devices.

The third internal switch 322*b* is configured to have a higher on-resistance than the second external switch 316*b*. For example, the third internal switch 322*b* may be physically smaller than the second external switch 316*b*.

The third internal switch 322*b* may be, for example, a relatively weak switch or FET (field effect transistor), and may have a programmable or controllable on-resistance. In examples where the third internal switch 322*b* has a programmable or controllable on-resistance, the IC 300 further includes second internal switch control circuitry 326*b* for controlling the on-resistance of the third internal switch 322*b*.

The third internal switch 322*b* forms part of a secondary current path, in parallel with the primary current path, for the second capacitor 314*b*, coupling the second capacitor 314*b* to ground. (The secondary current path for the second capacitor 314*b* also includes electrically conductive material such as a printed circuit board trace or track that electrically connects the second terminal of the second capacitor 314*b* to the second capacitor coupling terminal 324*b*, and electrically conductive material such as a lead wire within the IC 300 that connects the second capacitor coupling terminal 324*b* to the third internal switch 322*b*, and similar electrically conductive material within the IC 300 that connects the third internal switch 322*b* to the internal ground terminal 310).

As the on-resistance of the third internal switch 322*b* (whether fixed or programmable or controllable) is greater than that of the second external switch 316*b*, the secondary current path for the second capacitor 314*b* is current-limited, as compared to the primary current path for the second capacitor 314*b*.

The fourth internal switch 328*b*, where present, forms part of a tertiary current path, in parallel with the primary and secondary current paths, for the second capacitor 314*b*, coupling the second capacitor 314*b* to ground. (The tertiary current path also includes electrically conductive material such as a printed circuit board trace or track that electrically connects the second terminal of the second capacitor 314*b* to the second capacitor coupling terminal 324*b*, and electrically conductive material such as a lead wire within the IC 300 that connects the second capacitor coupling terminal 324*b* to the fourth internal switch 328*b*, and similar electrically conductive material within the IC 300 that connects the fourth internal switch 328*b* to the internal ground terminal 310).

The IC 300 further includes second control circuitry 330*b* for controlling operation of the third internal switch 322*b* and (if present) the fourth internal switch 328*b*.

The second control circuitry 330*b* in the illustrated example includes second comparator circuitry 332*b*, which in this example is hysteretic comparator circuitry. An inverting (−) input of the second comparator circuitry 332*b* is coupled to the second capacitor coupling terminal 324*b*, so as to receive a voltage indicative of a voltage at the second terminal of the second capacitor 314*b*. A non-inverting (+) input of the first comparator circuitry 332*a* receives a second predefined threshold voltage Vthresh2 (which may be equal to or different from the first predefined threshold voltage Vthresh1). Thus, the second comparator circuitry 332*b* is operative to compare a voltage indicative of the voltage at the second terminal of the second capacitor 314*b* to the second predefined threshold voltage Vthresh2.

An output of the second comparator circuitry 332*b* is coupled to an input of the second internal switch control circuitry 326*b*. An output of the second internal switch control circuitry 326*b* is coupled to a control terminal (e.g. a gate terminal) of the third internal switch 322*b*. In examples that include the fourth internal switch 328*b*, the output of the second comparator circuitry 332*b* or the output of the second internal switch control circuitry 326*b* may also be coupled to a control terminal (e.g. a gate terminal) of the fourth internal switch 328*b*.

The outputs of the first and second comparator circuitry 332*a*, 332*b* are also coupled to respective first and second inputs of the external switch control circuitry 340. An output of the external switch control circuitry 340 is coupled to the second output terminal 320 of the IC 300.

The external switch control circuitry 340 in this example includes logic circuitry 342 and external switch drive circuitry 344. The logic circuitry 342 is configured to receive output signals output by the first and second comparator circuitry 332*a*, 332*b* to output a control signal to the external switch drive circuitry 344 based on the received signals from the first and second comparator circuitry 332*a*, 332*b*. The external switch drive circuitry 344 generates and outputs an external switch drive signal SW2_Drive based on the control signal output by the logic circuitry 342 to actuate (e.g. switch on) or de-actuate (e.g. switch off) the first and second external switches 316*a*, 316*b*, thus enabling/selecting or disabling/deselecting the primary current paths for the first and second capacitors 314*a*, 314*a*.

It will be appreciated by those of ordinary skill in the art that the external switch control circuitry 340 could be implemented in other ways. For example, the logic circuitry 342 could be omitted, and the external switch drive circuitry 344 could be configured with first and second inputs for receiving the output signals output by the first and second comparator circuitry 332*a*, 332*b*. In such an example, the external switch drive circuitry 344 would be configured to generate and output the external switch drive signal SW2_Drive based on the output signals output by the first and second comparator circuitry 332*a*, 332*b*. Suitable configurations for the external switch drive circuitry 344 for use in such an example will be familiar to those skilled in the art.

In operation of a system incorporating the IC 300, the secondary current paths for the first and second external capacitors 314*a*, 314*b* containing, respectively, the first and third internal switches 322*a*, 322*b* may be selected or enabled (by actuating, e.g. switching on, the first and third internal switches 322*a*, 322*b*) for use in an initial or power-up phase of operation of the system, during which initial charging (or discharging) of the first and second external capacitors 314*a*, 314*b* is performed.

As noted above, the secondary current paths are current-limited, as compared to the primary current paths for the first and second capacitors 314*a*, 314*b*. By selecting the current-limited secondary current paths for use in the initial or power-up phase of operation, inrush current can be controlled to prevent damage caused by thermal or EMI effects and the capacitors 314*a*, 314*b* can be charged or discharged without causing transient effects.

In examples in which the on-resistances of the first and third internal switches 322*a*, 322*b* are programmable or controllable, the on-resistances of the first and third internal switches 322*a*, 322*b* can be set to a desired level, to limit the current in the secondary current paths to desired level, thus limiting inrush current during the initial or power-up phase.

Once the external capacitors 314*a*, 314*b* have charged to a predetermined level, the secondary current paths for the first and second external capacitors 314*a*, 314*b* are deselected or disabled (by de-actuating, e.g. switching off, the first and third internal switches 322*a*, 322*b*), and the primary current paths for the first and second external capacitors 314*a*, 314*b* are selected or enabled for use during normal (e.g. steady-state) operation of the system, by actuating (e.g. switching on) the first and second external switches 316*a*, 316*b*. With the primary current paths selected or enabled, relatively high currents that may flow during normal operation of the system flow through the external switches 316*a*, 316*b* rather than the first and third internal switches 322*a*, 322*b*, and are thus kept away from the IC 300, which helps to avoid EMI, thermal or routing issues.

Thus, the IC 300 is selectively operable in a first mode and a second mode. In the first mode, the current-limited secondary current paths are selected to couple the second terminals of the first and second capacitors 314*a*, 314*b* to ground. In the second mode, the primary current paths are selected to couple the second terminals of the first and second capacitors 314*a*, 314*b* to ground.

The first and second control circuitry 330*a*, 330*b* enables automatic switching between the first mode and the second mode.

As the first capacitor 314*a* charges up during operation in the first mode, the voltage at the first capacitor coupling terminal 324*a* falls. While the voltage at the first capacitor coupling terminal 324*a* is higher than the first predefined threshold voltage Vthresh1, an output signal output by the first comparator circuitry 332*a* is low. In response to receiving a low output signal from the first comparator circuitry 332*a*, the first internal switch control circuitry 326*a* actuates (e.g. switches on) the first internal switch 322*a*, to enable or select the secondary current path for the first external capacitor 314*a*.

Similarly, as the second capacitor 314*b* charges up during operation in the first mode, the voltage at the second capacitor coupling terminal 324*b* falls. While the voltage at the second capacitor coupling terminal 324*b* is higher than the second predefined threshold voltage Vthresh2, an output signal output by the second comparator circuitry 332*b* is low. In response to receiving a low output signal from the second comparator circuitry 332*b*, the second internal switch control circuitry 326*b* actuates (e.g. switches on) the third internal switch 322*b*, to enable or select the secondary current path for the second external capacitor 314*b*.

The external switch control circuitry 340 also receives the output signals output by the first and second comparator circuitry 332*a*, 332*b*. In response to receiving a low output signal from both the first comparator circuitry 332*a* and the second comparator circuitry 332*b*, the logic circuitry 342 outputs a control signal (e.g. a logic 0 signal) to the external switch drive circuitry 344 to cause the external switch drive circuitry 344 to generate and output an external switch drive signal SW2_Drive to maintain the first and second external switches 316*a*, 316*b* in a de-actuated (e.g. switched off) condition, thus disabling or deselecting the primary current paths for the first and second external capacitors 314*a*, 314*b*.

In examples of the IC 300 in which the on-resistances of the first and third internal switches 322*a*, 322*b* are programmable or controllable, the first and second internal switch control circuitry 326*a*, 326*b* may also set the on-resistance of the first and third internal switches 322*a*, 322*b* to a desired level in response to low output signals at the respective outputs of the first and second comparator circuitry 332*a*, 332*b*, to limit current (e.g. inrush current) in the secondary current paths for the first and second capacitors 314*a*, 314*b* to a desired level.

In examples of the IC 300 that include the second and fourth internal switches 328*a*, 328*b*, the internal switch control circuitry 326*a*, 326*b* may also de-actuate (e.g. switch off) the second and fourth internal switches 328*a*, 328*b* in response to low output signals at the outputs of the respective first and second comparator circuitry 332*a*, 332*b*, thus disabling or deselecting the tertiary current paths for the first and second external capacitors 314*a*, 314*b*.

When the voltage at the first capacitor coupling terminal 324*a* falls below the first predefined threshold voltage Vthresh1, the output of the first comparator circuitry 332*a* goes high. In response, the first internal switch control circuitry 326*a* de-actuates (e.g. switches off) the first internal switch 322*a*, thus disabling or deselecting the secondary current path for the first external capacitor 314*a*.

Similarly, when the voltage at the second capacitor coupling terminal 324*b* falls below the second predefined threshold voltage Vthresh2, the output of the second comparator circuitry 332*b* goes high. In response, the second internal switch control circuitry 326*b* de-actuates (e.g. switches off) the third internal switch 322*b*, thus disabling or deselecting the secondary current path for the second external capacitor 314*b*.

In response to receiving a high output signal from each of the first and second comparator circuitry 332*a*, 332*b*, the logic circuitry 342 of the external switch control circuitry 340 outputs a control signal (e.g. a logic 1 signal) to the external switch drive circuitry 344 to cause the external switch drive circuitry 344 to generate and output an external switch drive signal SW2_Drive to actuate (e.g. switch on) the first and second external switches 316*a*, 316*b*, thus enabling or selecting the primary current paths for the first and second external capacitors 314*a*, 314*b*.

It will be noted that the first and second external switches 316*a*, 316*b* are only actuated by the external switch control circuitry 340 when the outputs of the first comparator circuitry 332*a* and the second comparator circuitry 332*b* are both high. This prevents the primary current paths for the first and second external capacitors 314*a*, 314*b* from being selected or enabled until both the first external capacitor 314*a* and the second external capacitor 314*b* have been charged (or discharged) to a desired level. This prevents potentially damaging currents (e.g. high inrush currents) from flowing through the IC 300 while allowing the first and second capacitors 314*a*, 314*b* to be charged or discharged without causing transient effects. In applications in which only one of the first comparator circuitry 332*a* and the second comparator circuitry 332*b* are used (e.g. nothing is coupled to the second capacitor coupling terminal 324*b*), the inputs of the external switch control circuitry 340 or of the logic circuitry 342 may be coupled together in any suitable manner. Those skilled in the art will be readily able to implement suitable coupling of the inputs of the external switch control circuitry 340 or logic circuitry 342 as necessary.

In examples of the IC 300 that include the second and fourth internal switches 328*a*, 328*b*, the first and second internal switch control circuitry 326*a*, 326*b* may actuate (e.g. switch on) the second and fourth internal switches 328*a*, 328*b* in response to high output signals at the respective outputs of the first and second comparator circuitry 332*a*, 332*b*, thus enabling or selecting the tertiary current paths for the first and second external capacitors 314*a*, 314*b*.

The tertiary current paths may be enabled or selected in this way in addition to enabling or selecting the primary current paths for the first and second external capacitors 314*a*, 314*b*, such that a first current flows through the first external capacitor 314*a* and both the first external switch 316*a* and the second internal switch 328*a*, and a second current flows through the second external capacitor 314*b* and both the second external switch 316*b* and the fourth internal switch 328*b*.

Alternatively, the tertiary current paths may be enabled or selected instead of the primary current paths for the first and second external capacitors 314*a*, 314*b*, such that a first current flows through the first external capacitor 314*a* and only the second internal switch 328*a*, and a second current flows through the second external capacitor 314*b* and only the fourth internal switch 328*b*. It will be appreciated by those of ordinary skill in the art that this alternative of enabling or selecting only the tertiary current paths may be adopted if the IC 300 is configured in such a way as to accommodate the relatively high currents that flow during normal operation of a system incorporating the IC 300, e.g. if the second and fourth internal switches 328*a*, 328*b* are on a power plane.

In the example illustrated in FIG. 3 the IC 300 includes first fault detector circuitry 336*a* associated with (e.g. coupled to the output of) the first comparator circuitry 332*a*, for detecting faults in the first external switch 316*a* and/or the first external capacitor 314*a*, and second fault detector circuitry 336*b* associated with (e.g. coupled to the output of) the second comparator circuitry 332*b*, for detecting faults in the second external switch 316*b* and/or the second external capacitor 314*b*. The first and second fault detector circuitry 336*a*, 336*b* are configured and operable in the same way as the fault detector circuitry 136 of the IC 100 described above with reference to FIG. 1.

In other examples, the IC 300 may include a single instance of fault detector circuitry associated with (e.g. coupled to the outputs of) both the first and the second comparator circuitry 332*a*, 332*b* and operative to detect faults in the first and second external switches 316*a*, 316*b* and/or the first and second external capacitors 314*a*, 314*b*, in the same manner as the fault detector circuitry 136 of the IC 100.

Figure 4:
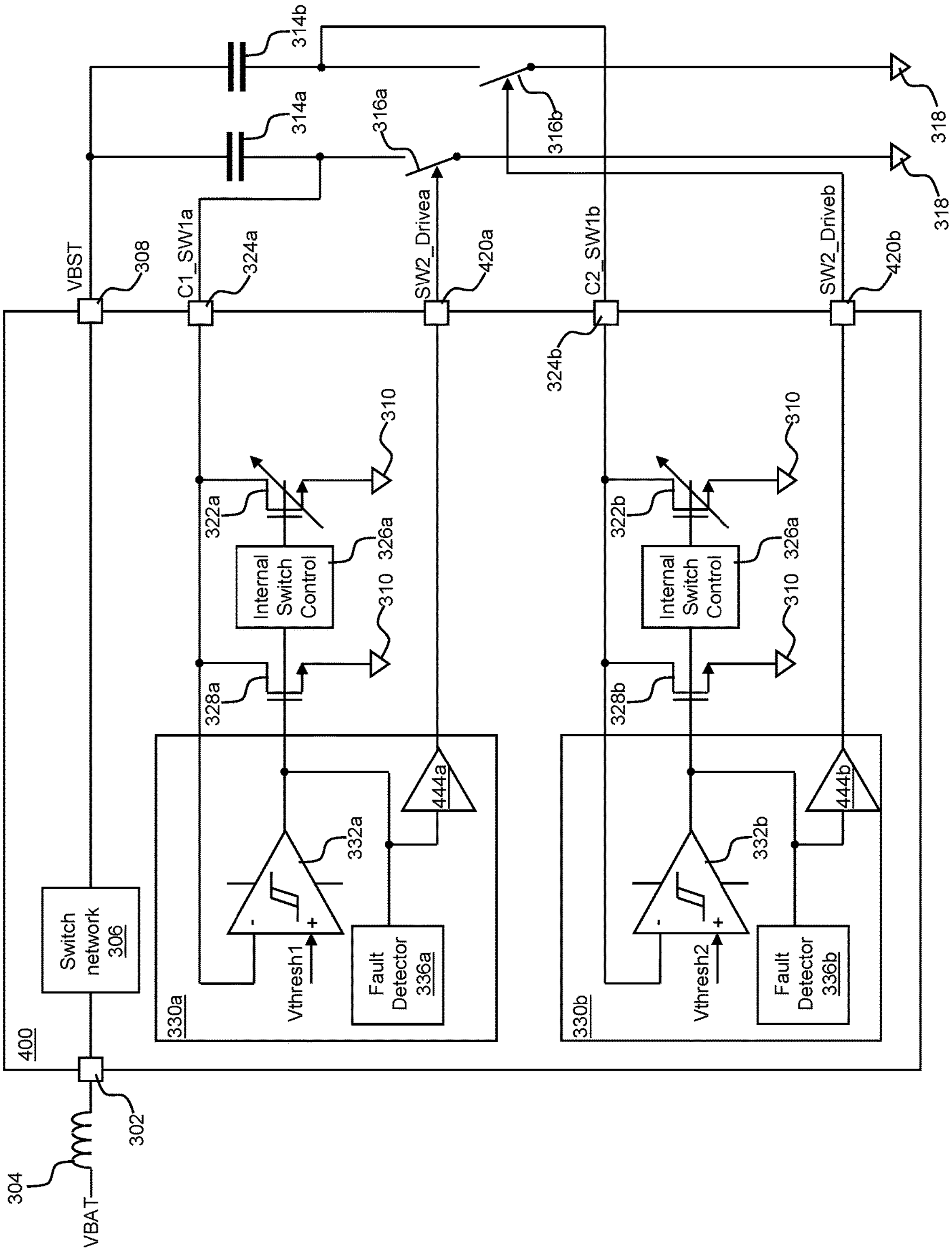
FIG. 4 is a schematic representation of a further alternative integrated circuit according to the present disclosure.

FIG. 4 is a schematic representation of an alternative integrated circuit (IC) according to the present disclosure for use applications in which the IC may be required to supply the output voltage VBST to a plurality of downstream components, systems or subsystems, each having its own external capacitor.

The IC 400 of FIG. 4 has many features in common with the IC 300 of FIG. 3. Such common features are denoted by common reference numerals in FIGS. 3 and 4, and will not be described again in detail here, for reasons of clarity and brevity.

The IC 400 differs from the IC 300 in that it permits independent control of the first and second external switches 316*a*, 316*b*. To this end, the first control circuitry 330*a* includes first external switch drive circuitry 344*a* and the second control circuitry 330*b* includes second external switch drive circuitry 344*b*.

An input of the first external switch drive circuitry 444*a* is coupled to the output of the first comparator circuitry 332*a* and an output of the first external switch drive circuitry 444*a* is coupled to a second output terminal 420*a* of the IC 400.

In use of the IC 400, a control terminal of the first output switch 316*a* is coupled to the second output terminal 420*a* of the IC 400, such that operation of the first output switch 316*a* is controlled according to a first switch control signal SW2_Drivea output by the first external switch drive circuitry 444*a*.

Similarly, an input of the second external switch drive circuitry 444*b* is coupled to the output of the second comparator circuitry 332*b* and an output of the second external switch drive circuitry 444*b* is coupled to a third output terminal 420*b* of the IC 400.

In use of the IC 400, a control terminal of the second output switch 316*b* is coupled to the third output terminal 420*b* of the IC 400, such that operation of the second output switch 316*b* is controlled according to a second switch control signal SW2_Driveb output by the second external switch drive circuitry 444*b*.

In use of the IC 400, the first comparator circuitry 332*a* is operative as described above to compare a voltage indicative of the voltage at the first capacitor coupling terminal 324*a* to a first predefined threshold voltage Vthresh1. The voltage at the first capacitor coupling terminal 324*a* falls as the first external capacitor 314*a* charges up.

While the voltage at the first capacitor coupling terminal 324*a* is greater than the first predefined threshold voltage Vthresh1, the output of the first comparator circuitry 322*a* is low, which causes the first internal switch 322*a* to be actuated (e.g. switched on) by the first internal switch control circuitry 326*a* to enable or select the secondary current path for the first external capacitor 314*a*, as described above with reference to FIG. 3.

In examples in which the on-resistance of the first internal switch 322*a* is programmable or controllable, the first internal switch control circuitry 326*a* may also set the on-resistance of the first internal switch 322*a* to a desired level.

The second internal switch 328*a* (if present) is also de-actuated (e.g. switched off) by the first internal switch control circuitry 326*a* in response to a low output signal output by the first comparator circuitry 332*a*.

The low output signal output by the first comparator circuitry 332*a* is also received by the first external switch drive circuitry 444*a*, which outputs a first switch control signal SW2_Drivea to de-actuate (e.g. switch off) the first external switch 316*a*, to disable or deselect the primary current path for the first external capacitor 314*a*.

When the voltage at the first capacitor coupling terminal 324*a* falls below the first predefined threshold voltage Vthresh1, the output of the first comparator circuitry 322*a* goes high, which causes the first internal switch 322*a* to be de-actuated (e.g. switched off) by the first internal switch control circuitry 326*a* to disenable or deselect the secondary current path for the first external capacitor 314*a*, as described above with reference to FIG. 3.

The high output signal output by the first comparator circuitry 332*a* is also received by the first external switch drive circuitry 444*a*, which outputs the first switch control signal SW2_Drivea to actuate (e.g. switch on) the first external switch 316*a*, to enable or select the primary current path for the first external capacitor 314*a*.

Additionally or alternatively, the first internal switch control circuitry 326*a* may actuate (e.g. switch on) the second internal switch 328*a* (if present) in response to a low output signal output by the first comparator circuitry 332*a*, to enable or select the tertiary current path for the first external capacitor 314*a*. Thus, the tertiary current path for the first external capacitor 314*a* may be selected or enabled in addition to or instead of the primary current path for the first external capacitor 314*a*, as described above.

The second comparator circuitry 330*b* and the second external switch drive circuitry 444*b* operate in a similar way as the first comparator circuitry 332*a* and the first external switch drive circuitry 444*a*.

Thus, while the voltage at the second capacitor coupling terminal 324*b* is greater than the second predefined threshold voltage Vthresh2, the output of the second comparator circuitry 332*b* is low, which causes the third internal switch 322*b* to be actuated (e.g. switched on) by the second internal switch control circuitry 326*b* to enable or select the secondary current path for the second external capacitor 314*b*, as described above with reference to FIG. 3.

In examples in which the on-resistance of the third internal switch 322*b* is programmable or controllable, the second internal switch control circuitry 326*b* may also set the on-resistance of the third internal switch 322*b* to a desired level.

The fourth internal switch 328*b* (if present) is also de-actuated (e.g. switched off) by the second internal switch control circuitry 326*b* in response to a low output signal output by the second comparator circuitry 332*b*.

The low output signal output by the second comparator circuitry 332*b* is also received by the second external switch drive circuitry 444*b*, which outputs a second switch control signal SW2_Driveb to de-actuate (e.g. switch off) the second external switch 316*b*, to disable or deselect the primary current path for the second external capacitor 314*b*.

When the voltage at the second capacitor coupling terminal 324*b* falls below the second predefined threshold voltage Vthresh2, the output of the second comparator circuitry 332*b* goes high, which causes the third internal switch 322*b* to be de-actuated (e.g. switched off) by the second internal switch control circuitry 326*b* to disable or deselect the secondary current path for the second external capacitor 314*b*, as described above with reference to FIG. 3.

The high output signal output by the second comparator circuitry 332*b* is also received by the second external switch drive circuitry 444*b*, which outputs the second switch control signal SW2_Driveb to actuate (e.g. switch on) the second external switch 316*b*, to enable or select the primary current path for the second external capacitor 314*b*.

Additionally or alternatively, the second internal switch control circuitry 326*b* may actuate (e.g. switch on) the fourth internal switch 328*b* (if present) in response to a low output signal output by the second comparator circuitry 332*b*, to enable or select the tertiary current path for the second external capacitor 314*b*. Thus, the tertiary current path for the second external capacitor 314*b* may be selected or enabled in addition to or instead of the primary current path for the second external capacitor 314*b*, as described above.

Thus, in contrast to the IC 300 of FIG. 3, the IC 400 of FIG. 4 allows independent control of the first and second external switches 316*a*, 316*b*, such that, for example, the primary and/or tertiary current paths for the first external capacitor 314*a* can be enabled while the current-limited secondary current path for the second external capacitor 314*b* is enabled to charge (or discharge) the second external capacitor 314*b* through the third internal switch 322*b*.

It will be appreciated by those of ordinary skill in the art that although the example ICs 300 and 400 each have two instances of an internal soft-ramp switch (the first and third internal switches 322*a*, 322*b*) and associated control circuitry, other examples could have three or more instances of an internal soft-ramp switch and associate control circuitry. Thus the present disclosure is not limited to examples having only two instances of the internal soft-ramp switch.

Figure 5A:
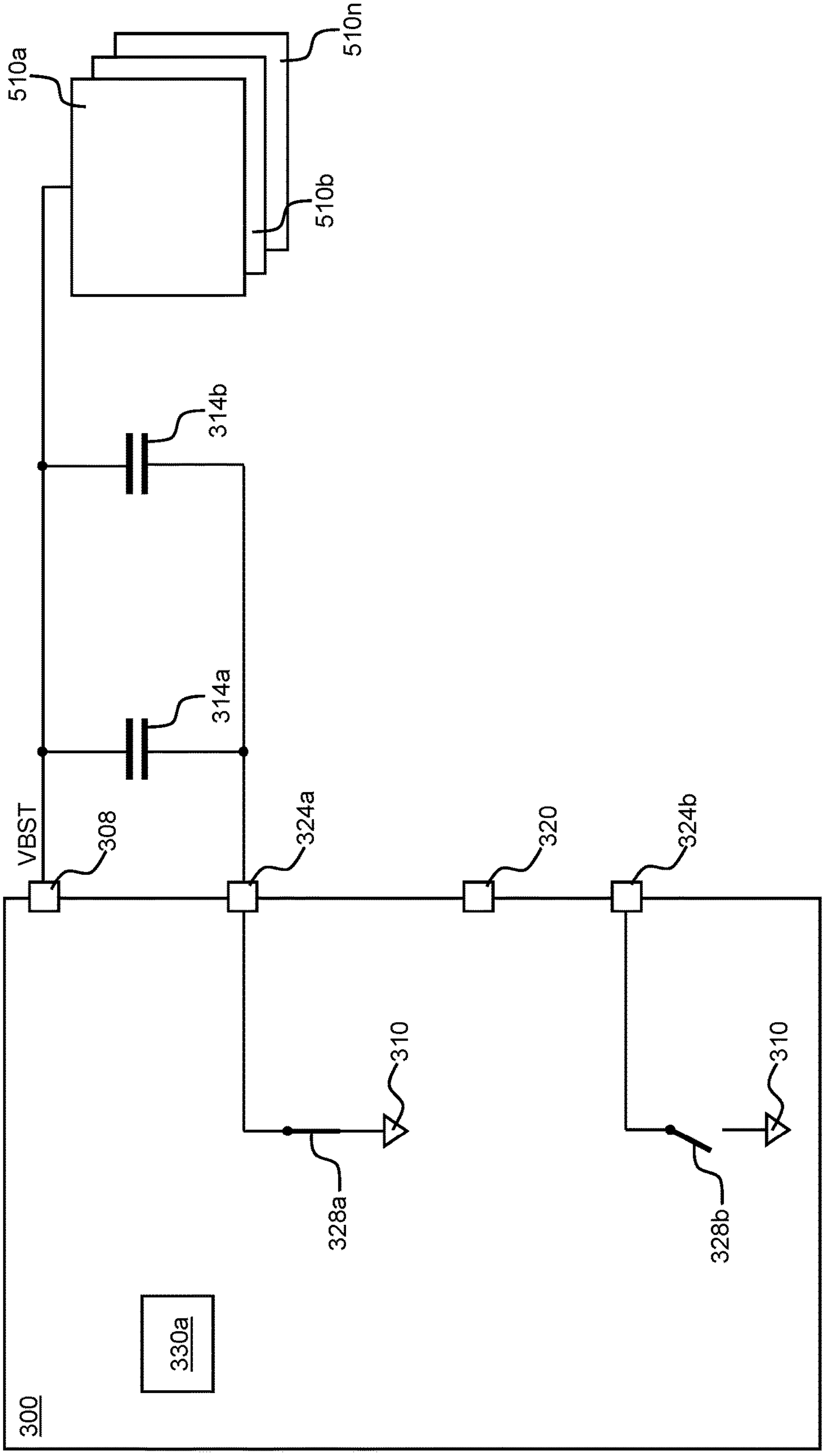
FIGS. 5*a*-5*f* are schematic representations of example applications of the integrated circuit of FIG. 3 or FIG. 4.

FIG. 5*a* shows an example application for the IC 300 of FIG. 3. In this example the IC 300 supplies the output voltage VBST to a plurality of downstream subsystems 510*a*, 510*b*, 510*n* which may be, for example, amplifiers.

The plurality of downstream subsystems 510*a*-510*n* are thus coupled to the first output terminal 308 of the IC 300.

A first capacitor (or bank of capacitors, as discussed above) 314*a* is located externally of the IC 300 in proximity to the IC 300 and a second capacitor (or bank of capacitors) 314*b* is located externally of the IC 300 in proximity to one or more of the downstream subsystems 510*a*-510*n*. A first terminal of the first external capacitor 314*a* is coupled to the first output terminal 308 of the IC 300. A second terminal of the first external capacitor 314*a* is coupled to the first capacitor coupling terminal 324*a* of the IC 300. Similarly, a first terminal of the second external capacitor 314*b* is coupled to the first output terminal 308 of the IC 300. A second terminal of the second external capacitor 314*b* is coupled to the second terminal of the first external capacitor 314*a* and thus to the first capacitor coupling terminal 324*a*. The first and second capacitors 314*a*, 314*b* are thus coupled in parallel, to implement a desired capacitance.

In use of the IC 300 in this application, the first internal switch 322*a* is actuated (e.g. switched on) in a first, initial or power-up mode of operation, during which initial charging (or discharging) of the external capacitors 314*a*, 314*b* is performed. The first internal switch 322*a* thus forms part of a secondary current path for the total capacitance implemented by the combination of the first external capacitor 314*a* and the second external capacitor 314*b*, which is enabled or selected by actuating the first internal switch 322*a*.

Once the first and second capacitors 314*a*, 314*b* have charged to a desired level, the IC 300 switches to a second, normal, mode of operation. The first internal switch control circuitry 330*a* de-actuates (e.g switches off) the first internal switch 322*a* to disable or deselect the secondary current path for the total capacitance implemented by the combination of the first and second external capacitors 314*a*, 314*b*, and actuates (e.g. switches on), the second internal switch 328*a* to enable or select a tertiary current path for the total capacitance implemented by the combination of the first and second external capacitors 314*a*, 314*b*. Thus in the application illustrated in FIG. 5*a* no switches are required externally of the IC 300 for the second, normal mode of operation.

Figure 5B:
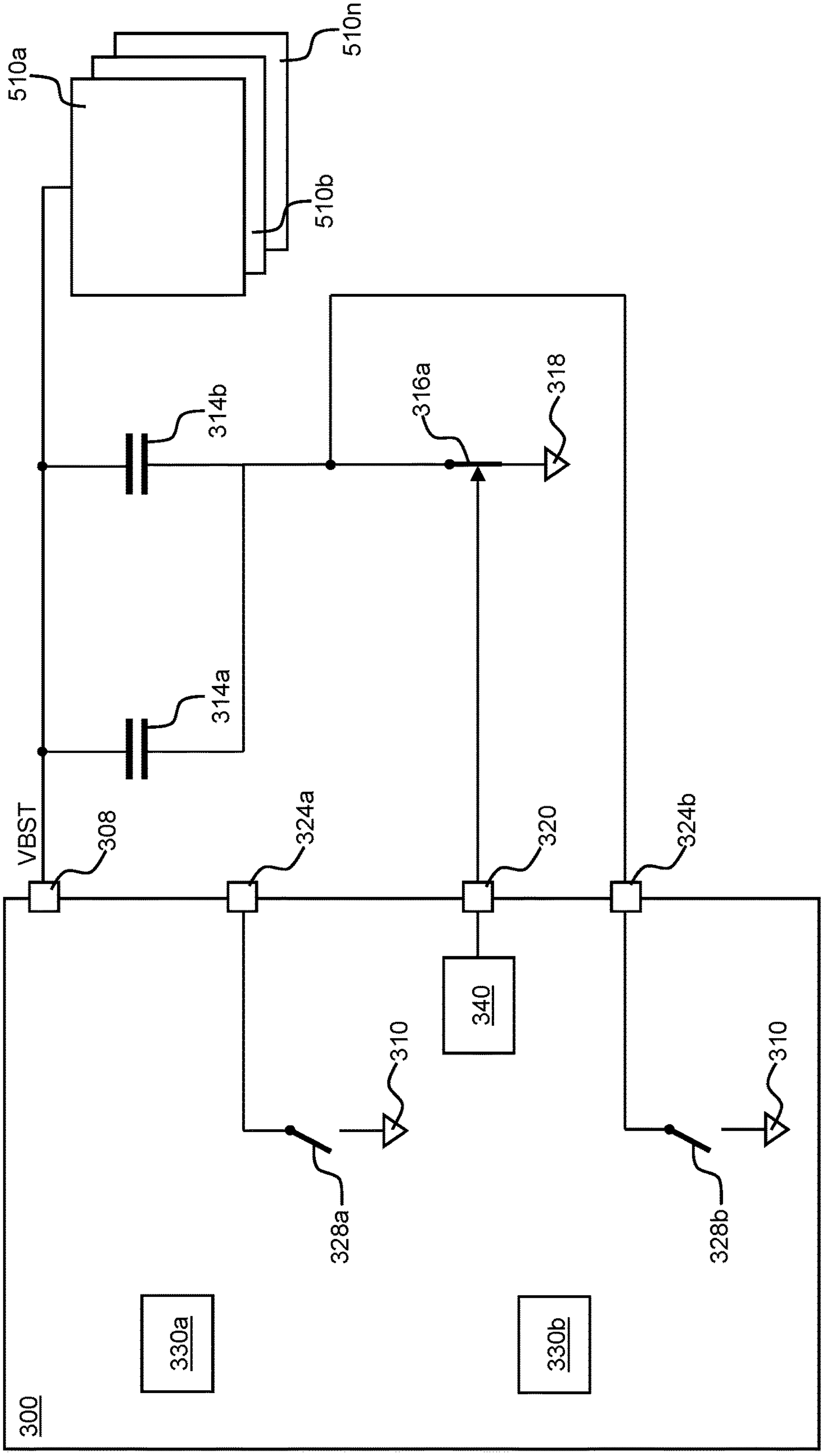

FIG. 5*b* shows another example application for the IC 300 of FIG. 3. This example application is similar to the example shown in FIG. 5*a*, with the exception that the second terminals of the first and second external capacitors 314*a*, 314*b* are not coupled to the first capacitor coupling terminal 324*a* of the IC 300.

Instead, the second terminals of the first and second capacitors 314*a*, 314*b* are coupled to the second capacitor coupling terminal 324*b* of the IC 300, and a first external switch 316*a* is coupled between the second terminals of the first and second external capacitors 314*a*, 314*b* and an external ground (or other reference voltage) rail 318. Thus, the first external switch 316*a* forms part of a primary current path for the total capacitance implemented by the parallel combination of first and second external capacitances 314*a*, 314*b*. A control terminal of the first external switch 316*a* is coupled to the second output terminal 320 of the IC 300 so as to receive a switch control signal SW2_Drive from the IC 300.

In use of the IC 300 in this application, the third internal switch 322*b* is actuated (e.g. switched on) in a first, initial or power-up mode of operation, during which initial charging (or discharging) of the external capacitors 314*a*, 314*b* is performed. The third internal switch 322*b* thus forms part of a secondary current path for the total capacitance implemented by the combination of the first external capacitor 314*a* and the second external capacitor 314*b*, which is enabled or selected by actuating the third internal switch 322*b*.

Once the first and second capacitors 314*a*, 314*b* have charged to a desired level, the IC 300 switches to a second, normal, mode of operation. The second internal switch control circuitry 330*b* de-actuates (e.g switches off) the third internal switch 322*b* to disable or deselect the secondary current path for the total capacitance implemented by the combination of the first and second external capacitors 314*a*, 314*b*. The external switch control circuitry 340 generates and outputs an external switch drive signal SW2_Drive to actuate (e.g. switch on) the first external switches 316*a*, thus enabling or selecting the primary current path for the total capacitance implemented by the parallel combination of the first and second external capacitors 314*a*, 314*b*.

In this application open fault detection of the first external switch 316*a* is possible, because the voltage at the second terminal of the second external capacitor 314*a* (to which the first external switch 316*a* is coupled) is monitored by the second internal switch control circuitry 330*b*.

Figure 5C:
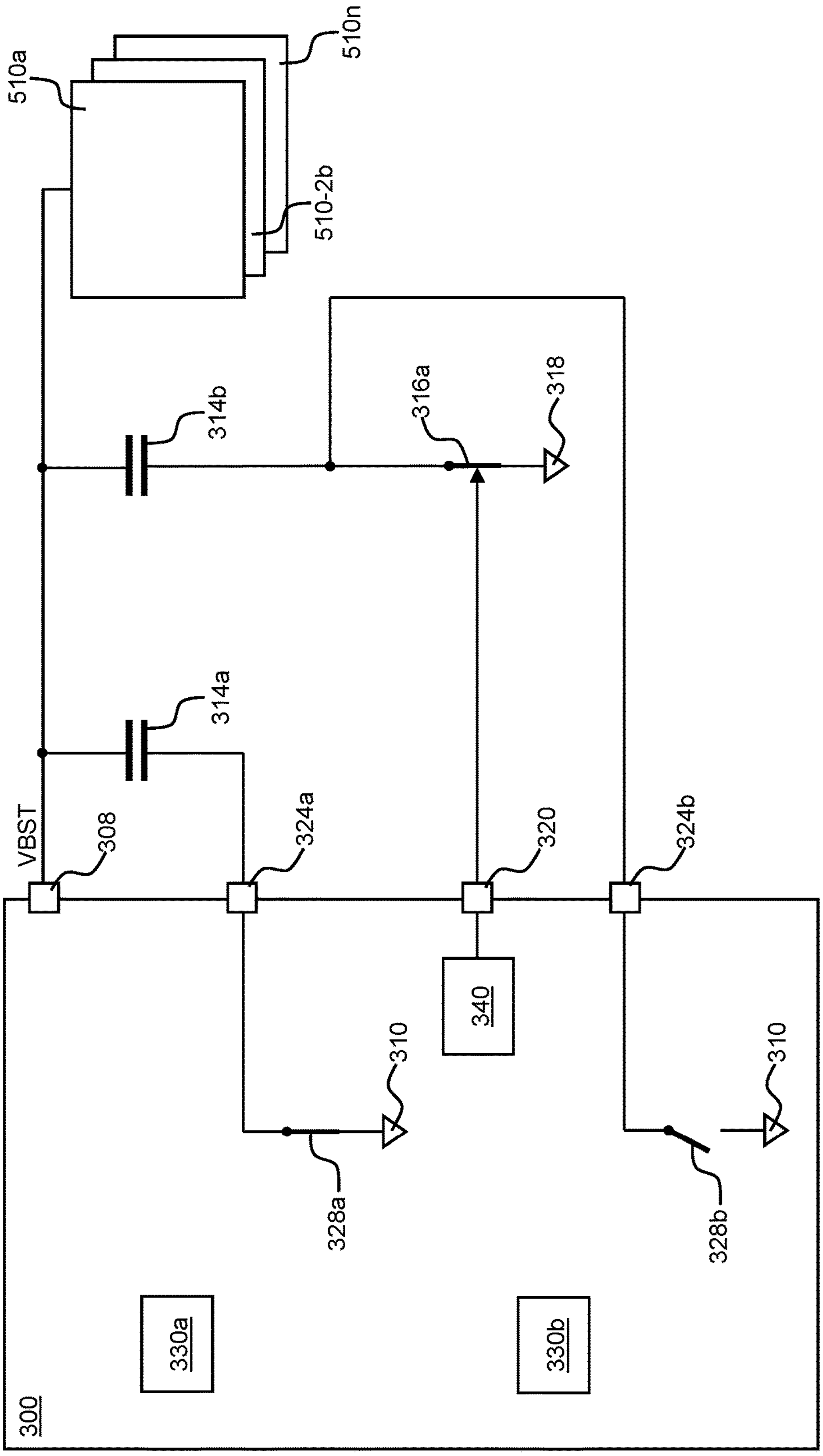

FIG. 5*c* shows another example application for the IC 300 of FIG. 3. In this example application the IC 300 again supplies the output voltage VBST to a plurality of downstream subsystems 510*a*, 510*b*, 510*n* which may be, for example, amplifiers. The plurality of downstream subsystems 510*a*-510*n* are thus coupled to the first output terminal 308 of the IC 300.

A first capacitor (or bank of capacitors, as discussed above) 314*a* is located externally of the IC 300 in proximity to the IC 300 and a second capacitor (or bank of capacitors) 314*b* is located externally of the IC 300 in proximity to one or more of the downstream subsystems 510*a*-510*n*. A first terminal of the first external capacitor 314*a* is coupled to the first output terminal 308 of the IC 300, and a second terminal of the first external capacitor 314*a* is coupled to the first capacitor coupling terminal 324*a* of the IC 300.

A first terminal of the second external capacitor 314*b* is coupled to the first output terminal 308 of the IC 300, and a second terminal of the second external capacitor 314*b* is coupled to the second capacitor coupling terminal 324*b* of the IC 300 and to a first terminal of first external switch 316*a*. A second terminal of the first external switch 316*a* is coupled to an external ground (or other reference voltage rail) 318. A control terminal of the first external switch 316*a* is coupled to the second output terminal 320 of the IC 300 so as to receive a switch control signal SW2_Drive from the IC 300.

In use of the IC 300 in this application, the first and third internal switches 322*a*, 322*b* are actuated (e.g. switched on) in a first, initial or power-up mode of operation, during which initial charging (or discharging) of the external capacitors 314*a*, 314*b* is performed. The first internal switch 322*a* thus forms part of a secondary current path for the first external capacitor 314*a*, which is enabled or selected by actuating the first internal switch 322*a*. Similarly, the third internal switch 322*b* forms part of a secondary current path for the second external capacitor 314*b*, which is enabled or selected by actuating the third internal switch 322*b*.

Once the first and second capacitors 314*a*, 314*b* have charged to a desired level, the IC 300 switches to a second, normal, mode of operation. The first internal switch control circuitry 330*a* de-actuates (e.g. switches off) the first internal switch 322*a* to disable or deselect the secondary current path for the first external capacitor 314*a*, and actuates (e.g. switches on) the second internal switch 328*a* to enable or select a tertiary current path for the first external capacitor 314*a*. The second internal switch control circuitry 330*b* de-actuates (e.g. switches off) the third internal switch to disable or deselect the secondary current path for the second external capacitor 314*b*. The external switch control circuitry 340 generates and outputs an external switch drive signal SW2_Drive to actuate (e.g. switch on) the first external switch 316*a*, thus enabling or selecting the primary current path for the second external capacitor 314*b*.

Thus in this application, in the second (normal) mode of operation, a first current flows through the tertiary current path for the first external capacitor 314*a* that includes the second internal switch 328*a*, and a second current flows through the primary current path for the second external capacitor 314*b* that includes the first external switch 316*a*.

As in the application shown in FIG. 5*b*, in this application open fault detection of the first external switch 316*a* is possible, because the voltage at the second terminal of the second external capacitor 314*b* (to which the first external switch 316*a* is coupled) is monitored by the second internal switch control circuitry 330*b*.

Figure 5D:
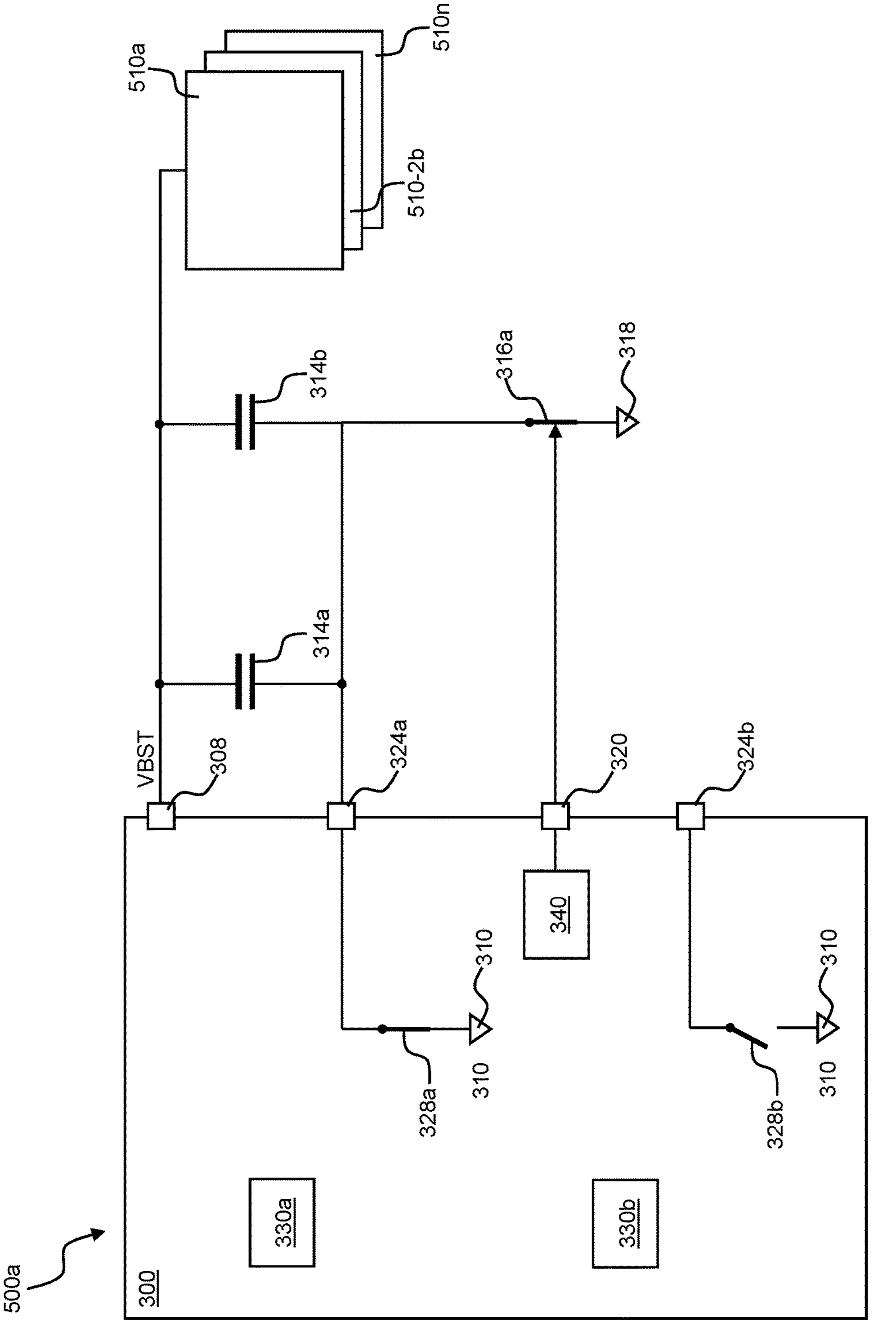

FIG. 5*d* shows a further example application for the IC 300 of FIG. 3. In this example application the IC 300 again supplies the output voltage VBST to a plurality of downstream subsystems 510*a*, 510*b*, 510*n* which may be, for example, amplifiers. The plurality of downstream subsystems 510*a*-510*n* are thus coupled to the first output terminal 308 of the IC 300.

A first capacitor (or bank of capacitors, as discussed above) 314*a* is located externally of the IC 300 in proximity to the IC 300 and a second capacitor (or bank of capacitors) 314*b* is located externally of the IC 300 in proximity to one or more of the downstream subsystems 510*a*-510*n*. A first terminal of the first external capacitor 314*a* is coupled to the first output terminal 308 of the IC 300, and a second terminal of the first external capacitor 314*a* is coupled to the first capacitor coupling terminal 324*a* of the IC 300. Similarly, a first terminal of the second external capacitor 314*b* is coupled to the first output terminal 308 of the IC 300, and a second terminal of the second external capacitor 314*b* is coupled to the second terminal of the first external capacitor 314*a* and thus to the first capacitor coupling terminal 324*a*. The first and second external capacitors 314*a*, 314*b* are thus coupled in parallel to implement a desired total capacitance.

The second terminal of the second external capacitor 314*b* is also coupled to a first terminal of a first external switch 316*a*. A second terminal of the first external switch 316*a* is coupled to an external ground (or other reference voltage rail) 318. A control terminal of the first external switch 316*a* is coupled to the second output terminal 320 of the IC 300 so as to receive a switch control signal SW2_Drive from the IC 300.

In use of the IC 300 in this application, the first and third internal switches 322*a*, 322*b* are actuated (e.g. switched on) in a first, initial or power-up mode of operation, during which initial charging (or discharging) of the external capacitors 314*a*, 314*b* is performed. The first internal switch 322*a* thus forms part of a secondary current path for the first external capacitor 314*a*, which is enabled or selected by actuating the first internal switch 322*a*. Similarly, the third internal switch 322*b* forms part of a secondary current path for the second external capacitor 314*b*, which is enabled or selected by actuating the third internal switch 322*b*.

Once the first and second capacitors 314*a*, 314*b* have charged to a desired level, the IC 300 switches to a second, normal, mode of operation. The first internal switch control circuitry 330*a* de-actuates (e.g. switches off) the first internal switch 322*a* to disable or deselect the secondary current path for the first external capacitor 314*a*, and actuates (e.g. switches on) the second internal switch 328*a* to enable or select a tertiary current path for the first external capacitor 314*a*. The second internal switch control circuitry 330*b* de-actuates (e.g. switches off) the third internal switch to disable or deselect the secondary current path for the second external capacitor 314*b*. The external switch control circuitry 340 generates and outputs an external switch drive signal SW2_Drive to actuate (e.g. switch on) the first external switch 316*a*, thus enabling or selecting the primary current path for the second external capacitor 314*b*.

Thus in this application, in the second (normal) mode of operation, current flows through both a tertiary current path (that includes the second internal switch 328*a*) for the total capacitance implemented by parallel combination of the first and second external capacitors 314*a*, 314*b*, and through a primary current path (that includes the first external switch 316*a*) for the total capacitance.

In this application open fault detection of the first external switch 316*a* is not possible, because although the voltage at the second terminal of the second external capacitor 314*b* (to which the first external switch 316*a* is coupled) is monitored by the second internal switch control circuitry 330*b*, in the event that this voltage increased, it would not be possible to determine whether the fault was in the first external switch 316*a* or the second internal switch 328*a*.

Figure 5E:
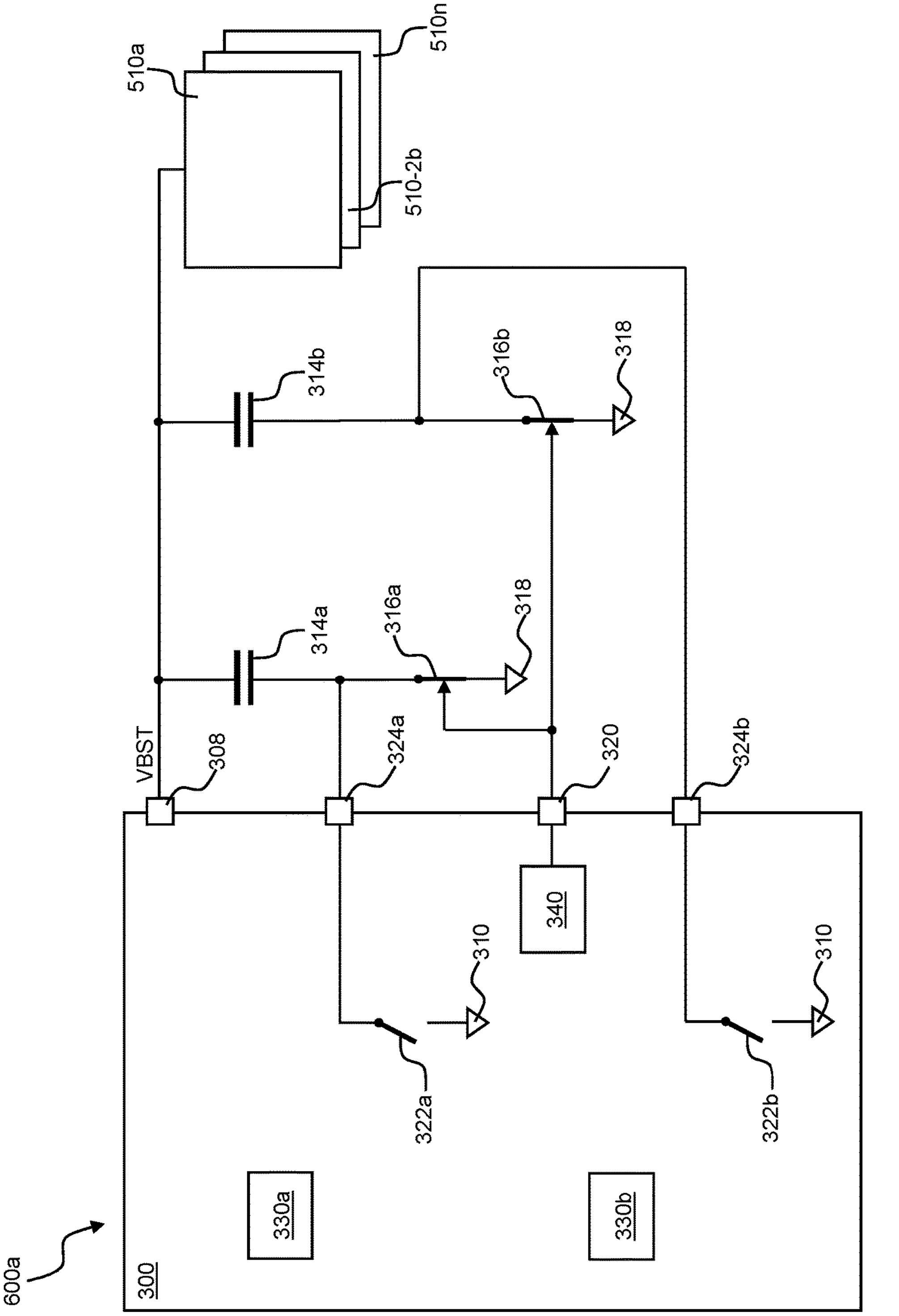

FIG. 5*e* shows a further example application for the IC 300 of FIG. 3. In this example application the IC 300 again supplies the output voltage VBST to a plurality of downstream subsystems 510*a*, 510*b*, 510*n* which may be, for example, amplifiers. The plurality of downstream subsystems 510*a*-510*n* are thus coupled to the first output terminal 308 of the IC 300.

A first capacitor (or bank of capacitors, as discussed above) 314*a* is located externally of the IC 300 in proximity to the IC 300 and a second capacitor (or bank of capacitors) 314*b* is located externally of the IC 300 in proximity to one or more of the downstream subsystems 510*a*-510*n*. A first terminal of the first external capacitor 314*a* is coupled to the first output terminal 308 of the IC 300, and a second terminal of the first external capacitor 314*a* is coupled to the first capacitor coupling terminal 324*a* of the IC 300 and to a first terminal of a first external switch 316*a*. A second terminal of the first external switch 316*a* is coupled to an external ground (or other reference voltage rail) 318. A control terminal of the first external switch 316*a* is coupled to the second output terminal 320 of the IC 300 so as to receive a switch control signal SW2_Drive from the IC 300.

Similarly, a first terminal of the second external capacitor 314*b* is coupled to the first output terminal 308 of the IC 300, and a second terminal of the second external capacitor 314*b* is coupled to the second capacitor coupling terminal 324*b* of the IC 300 and to a first terminal of a second external switch 316*b*. A second terminal of the second external switch 316*b* is coupled to an external ground (or other reference voltage rail) 318. A control terminal of the second external switch 316*b* is coupled to the second output terminal 320 of the IC 300 so as to receive the switch control signal SW2_Drive from the IC 300.

In use of the IC 300 in this application, the first and third internal switches 322*a*, 322*b* are actuated (e.g. switched on) in a first, initial or power-up mode of operation, during which initial charging (or discharging) of the external capacitors 314*a*, 314*b* is performed. The first internal switch 322*a* thus forms part of a secondary current path for the first external capacitor 314*a*, which is enabled or selected by actuating the first internal switch 322*a*. Similarly, the third internal switch 322*b* forms part of a secondary current path for the second external capacitor 314*b*, which is enabled or selected by actuating the third internal switch 322*b*.

Once the first and second capacitors 314*a*, 314*b* have charged to a desired level, the IC 300 switches to a second, normal, mode of operation. The first internal switch control circuitry 330*a* de-actuates (e.g. switches off) the first internal switch 322*a* to disable or deselect the secondary current path for the first external capacitor 314*a*, and the second internal switch control circuitry 330*b* de-actuates (e.g. switches off) the third internal switch 322*b* to disable or deselect the secondary current path for the second external capacitor 314*b*.

The external switch control circuitry 340 generates and outputs an external switch drive signal SW2_Drive to actuate (e.g. switch on) the first and second external switches 316*a*, 316*b* thus enabling or selecting the primary current paths for the first and second external capacitors 314*a*, 314*b*.

Thus in this application, in the second (normal) mode of operation, a first current flows through the primary current path (that includes the first external switch 316*a*) for the first external capacitor 314*a* and a second current flows through the primary current path (that includes the second external switch 316*b*) for the second external capacitor 314*b*.

In this application open fault detection of both the first external switch 316*a* and the second external switch 316*b* is possible, because the voltage at the second terminals of both the first external capacitor 314*a* (to which the first external switch 316*a* is coupled) is monitored by the first internal switch control circuitry 330*a* and the voltage at the second terminal of the second capacitor 314*b* (to which the second external switch 316*b* is coupled) is monitored by the second internal switch control circuitry 330*b*.

Figure 5F:
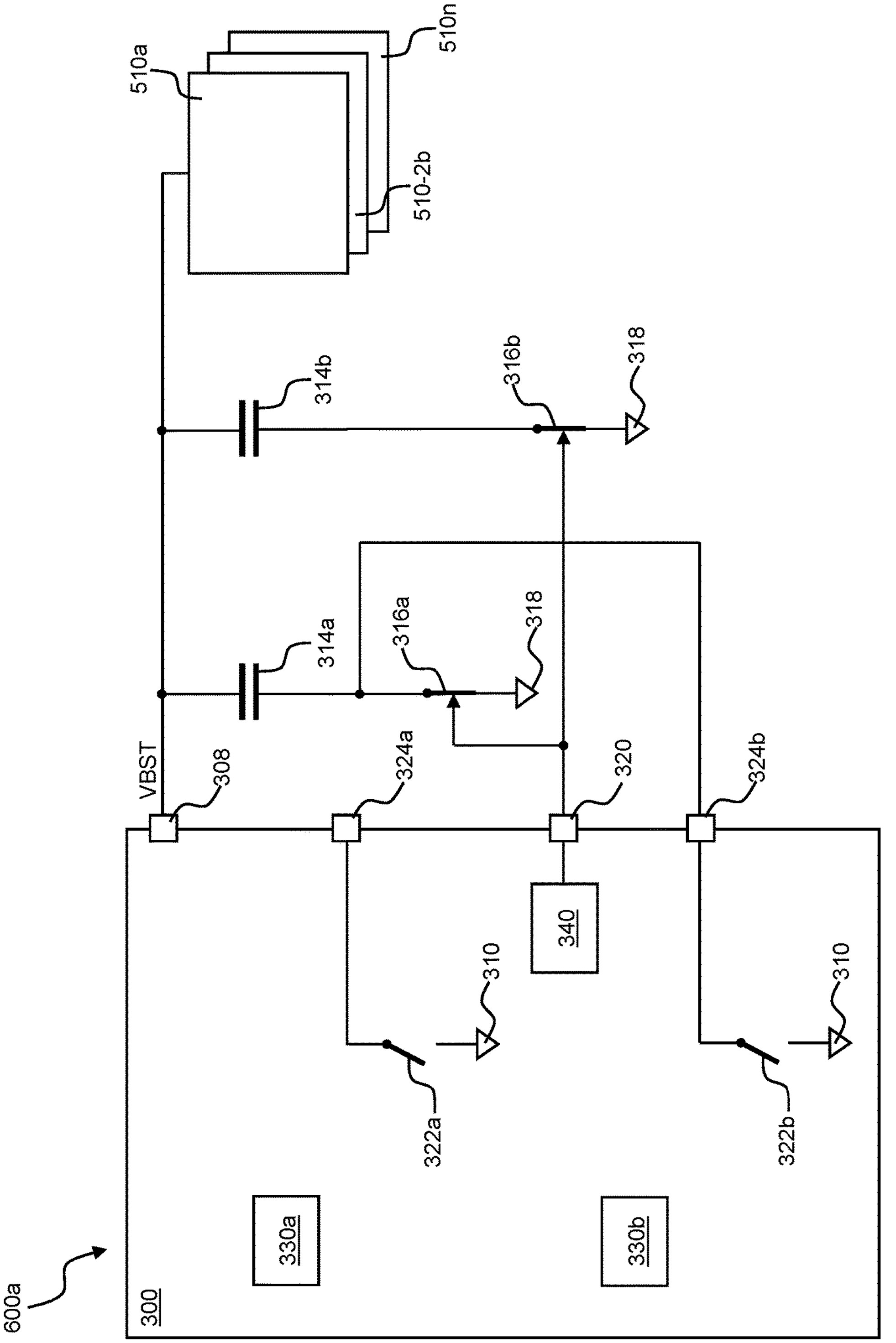

FIG. 5*f* shows a further example application for the IC 300 of FIG. 3. In this example application the IC 300 again supplies the output voltage VBST to a plurality of downstream subsystems 510*a*, 510*b*, 510*n* which may be, for example, amplifiers. The plurality of downstream subsystems 510*a*-510*n* are thus coupled to the first output terminal 308 of the IC 300.

A first capacitor (or bank of capacitors, as discussed above) 314*a* is located externally of the IC 300 in proximity to the IC 300 and a second capacitor (or bank of capacitors) 314*b* is located externally of the IC 300 in proximity to one or more of the downstream subsystems 510*a*-510*n*. A first terminal of the first external capacitor 314*a* is coupled to the first output terminal 308 of the IC 300, and a second terminal of the first external capacitor 314*a* is coupled to the second capacitor coupling terminal 324*b* of the IC 300 and to a first terminal of a first external switch 316*a*. A second terminal of the first external switch 316*a* is coupled to an external ground (or other reference voltage rail) 318. A control terminal of the first external switch 316*a* is coupled to the second output terminal 320 of the IC 300 so as to receive a switch control signal SW2_Drive from the IC 300.

A first terminal of the second external capacitor 314*b* is coupled to the first output terminal 308 of the IC 300, and a second terminal of the second external capacitor 314*b* is coupled to a first terminal of a second external switch 316*b*. A second terminal of the second external switch 316*b* is coupled to the external ground (or other reference voltage rail) 318. A control terminal of the second external switch 316*b* is coupled to the second output terminal 320 of the IC 300 so as to receive the switch control signal SW2_Drive from the IC 300.

In use of the IC 300 in this application, the first and third internal switches 322*a*, 322*b* are actuated (e.g. switched on) in a first, initial or power-up mode of operation, during which initial charging (or discharging) of the external capacitors 314*a*, 314*b* is performed. The first internal switch 322*a* thus forms part of a secondary current path for the first external capacitor 314*a*, which is enabled or selected by actuating the first internal switch 322*a*. Similarly, the third internal switch 322*b* forms part of a secondary current path for the second external capacitor 314*b*, which is enabled or selected by actuating the third internal switch 322*b*.

Once the first and second capacitors 314*a*, 314*b* have charged to a desired level, the IC 300 switches to a second, normal, mode of operation. The first internal switch control circuitry 330*a* de-actuates (e.g. switches off) the first internal switch 322*a* to disable or deselect the secondary current path for the first external capacitor 314*a*, and the second internal switch control circuitry 330*b* de-actuates (e.g. switches off) the third internal switch 322*b* to disable or deselect the secondary current path for the second external capacitor 314*b*.

The external switch control circuitry 340 generates and outputs an external switch drive signal SW2_Drive to actuate (e.g. switch on) the first and second external switches 316*a*, 316*b* thus enabling or selecting the primary current paths for the first and second external capacitors 314*a*, 314*b*.

Thus in this application, in the second (normal) mode of operation, a first current flows through the primary current path (that includes the first external switch 316*a*) for the first external capacitor 314*a* and a second current flows through the primary current path (that includes the second external switch 316*b*) for the second external capacitor 314*b*.

In contrast to the application shown in FIG. 5*e*, in this application open fault detection of the second external switch is not possible, because the voltage at the second terminal of the second capacitor 314*b* (to which the second external switch 316*b* is coupled) is not available.

As will be apparent from the foregoing discussion of FIGS. 5*a*-5*f*, the IC 300 can support a wide variety of applications and use cases. It will be appreciated by those of ordinary skill in the art that the IC 400 of FIG. 4 is similarly suitable for a wide variety of applications and use cases, and could be used in place of the IC 300 in the applications shown in FIGS. 5*a*-5*f*, with appropriate selection of either the second output terminal 320*a* or the third output terminal 320*b* where the second output terminal 320 of the IC 300 would be used.

Figure 6A:
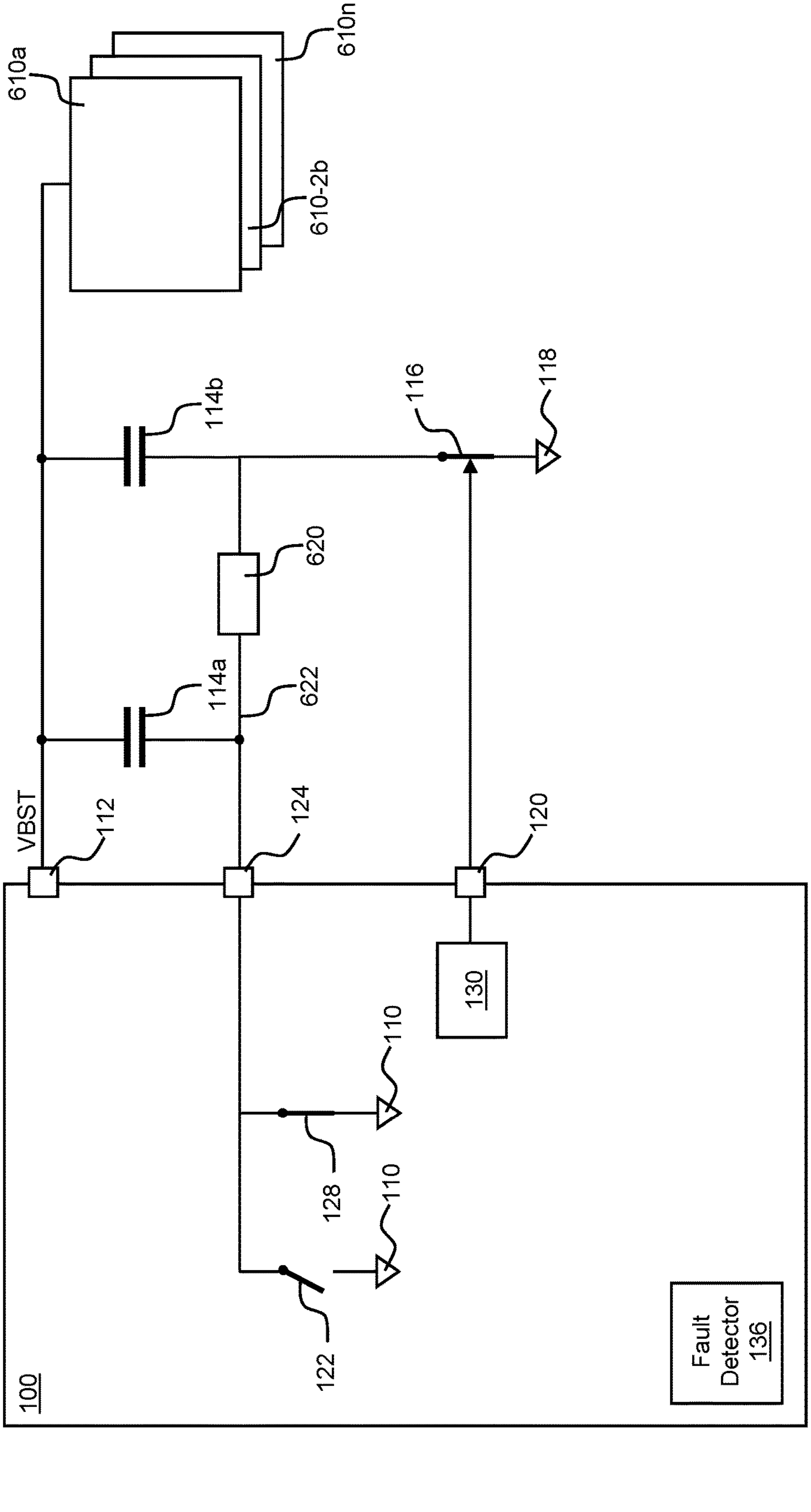
FIGS. 6*a*-6*b* are schematic representations of example applications of the integrated circuit of FIG. 1.

FIG. 6*a* shows an example application for the IC 100 of FIG. 1. In this example the IC 100 supplies the output voltage VBST to a plurality of downstream subsystems 610*a*, 610*b*, 610*n* which may be, for example, amplifiers. The plurality of downstream subsystems 610*a*-610*n* are thus coupled to the first output terminal 112 of the IC 100.

A first capacitor (or bank of capacitors, as discussed above) 114*a* is located externally of the IC 100 in proximity to the IC 100 and a second capacitor (or bank of capacitors) 114*b* is located externally of the IC 100 in proximity to one or more of the downstream subsystems 610*a*-610*n*. A first terminal of the first external capacitor 114*a* is coupled to the first output terminal 112 of the IC 100. A second terminal of the first external capacitor 114*a* is coupled to the capacitor coupling terminal 124 of the IC 100. Similarly, a first terminal of the second external capacitor 114*b* is coupled to the first output terminal 112 of the IC 100. A second terminal of the second external capacitor 114*b* is coupled to the second terminal of the first external capacitor 114*a* via a resistor 620 and thus to the first capacitor coupling terminal

124. The second terminal of the second external capacitor 114*b* is also coupled, via the external switch 116, to the external ground rail 118.

In use of the IC 100 in this application, the first internal switch 122 is actuated (e.g. switched on) in a first, initial or power-up mode of operation, during which initial charging (or discharging) of the external capacitors 114*a*, 114*b* is performed. The second internal switch 128 and the external switch 116 are de-actuated (e.g. switched off) in this mode. The first internal switch 122 thus forms part of a secondary current path for the total capacitance implemented by the combination of the first external capacitor 114*a* and the second external capacitor 114*b*, which is enabled or selected by actuating the first internal switch 122. Current in a circuit trace or track 622 that couples the second terminal of the first external capacitor 114*a* to the second terminal of the second external capacitor 114*b* is limited by the resistor 620.

Once the first and second capacitors 114*a*, 114*b* have charged to a desired level, the IC 100 switches to a second, normal, mode of operation. The internal switch control circuitry 130 de-actuates (e.g switches off) the first internal switch 122 and actuates (e.g. switches on), the second internal switch 128 and the external switch 116, as shown in FIG. 6*a*. When the second internal switch 128 and the external switch 116 are actuated in this way, the resistor 620 provides a degree of isolation between the second terminal of the first external capacitor 114*a* and the second terminal of the second external capacitor 114*b*. Thus, the second internal switch 128 forms part of a primary current path for the first external capacitor 114*a* and the external switch 116 forms part of a primary current path for the second external capacitor 114*b*.

This application permits current-controlled charging (or discharging) of the first and second external capacitors 114*a*, 114*b* in the first, initial or power-up mode of operation and independent control of the second internal switch 128 and the external switch 116 in the second, normal, mode of operation.

Figure 6B:
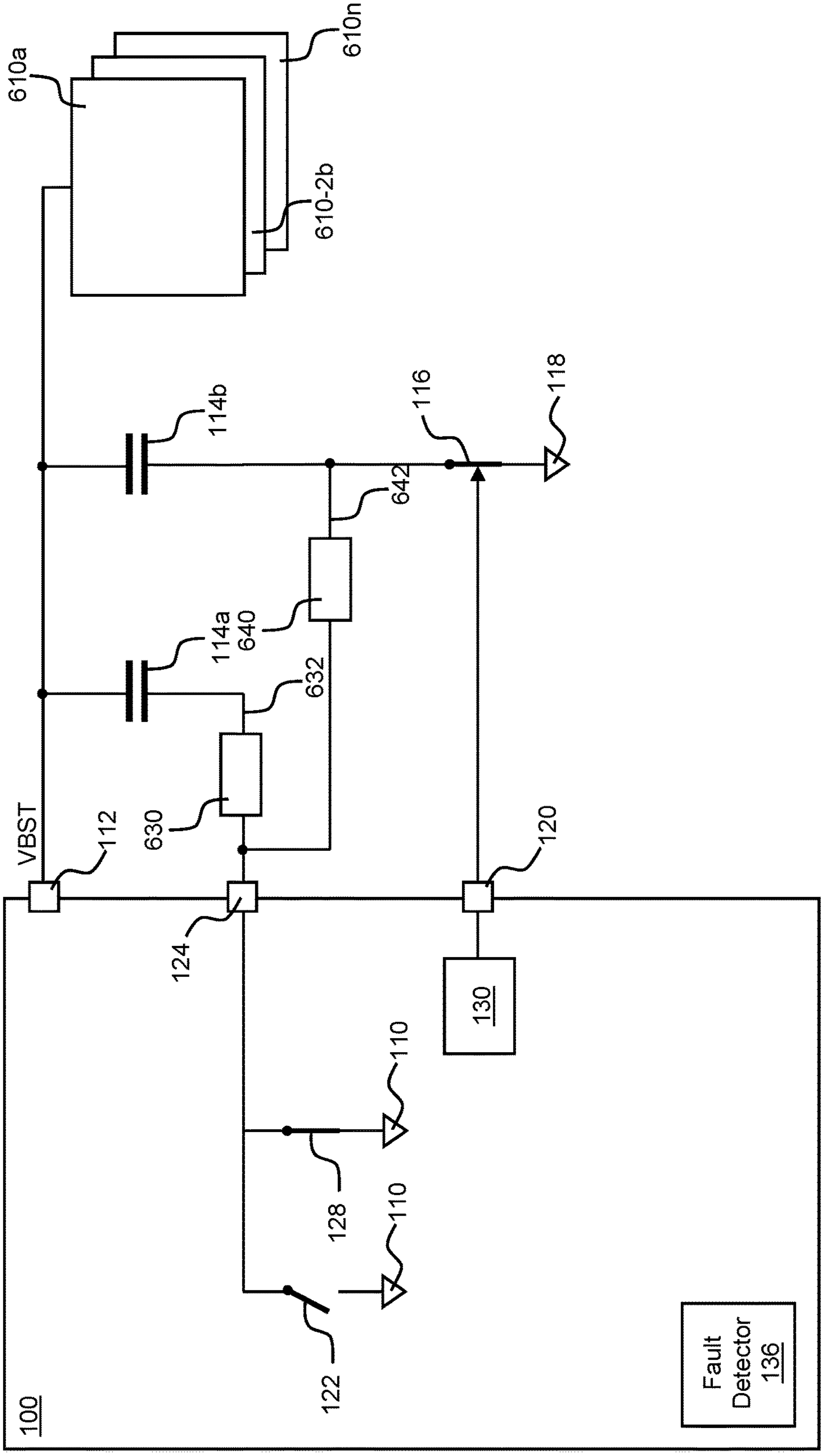

FIG. 6*b* shows a further example application for the IC 100 of FIG. 1. In this example the IC 100 again supplies the output voltage VBST to a plurality of downstream subsystems 610*a*, 610*b*, 610*n* which may be, for example, amplifiers. The plurality of downstream subsystems 610*a*-610*n* are thus coupled to the first output terminal 112 of the IC 100.

A first capacitor (or bank of capacitors, as discussed above) 114*a* is located externally of the IC 100 in proximity to the IC 100 and a second capacitor (or bank of capacitors) 114*b* is located externally of the IC 100 in proximity to one or more of the downstream subsystems 610*a*-610*n*. A first terminal of the first external capacitor 114*a* is coupled to the first output terminal 112 of the IC 100. A second terminal of the first external capacitor 114*a* is coupled to the capacitor coupling terminal 124 of the IC 100, via a first resistor 630. Similarly, a first terminal of the second external capacitor 114*b* is coupled to the first output terminal 112 of the IC 100 and a second terminal of the second external capacitor 114*b* is coupled to the capacitor coupling terminal 124 via a second resistor 640. The second terminal of the second external capacitor 114*b* is also coupled, via the external switch 116, to the external ground rail 118.

In use of the IC 100 in this application, the first internal switch 122 is actuated (e.g. switched on) in a first, initial or power-up mode of operation, during which initial charging (or discharging) of the external capacitors 114*a*, 114*b* is performed. The second internal switch 128 and the external switch 116 are de-actuated (e.g. switched off) in this mode. The first internal switch 122 thus forms part of a secondary current path for the total capacitance implemented by the combination of the first external capacitor 114*a* and the second external capacitor 114*b*, which is enabled or selected by actuating the first internal switch 122. Current in a first circuit trace or track 632 that couples the second terminal of the first external capacitor 114*a* to the capacitor coupling terminal 124 is limited by the resistor 630, and current in a second circuit trace or track 642 that couples the second terminal of the second external capacitor 114*a* to the capacitor coupling terminal 124 is limited by the resistor 630.

The first internal switch 122 thus forms part of a secondary current path for the total capacitance implemented by the combination of the first external capacitor 114*a* and the second external capacitor 114*b*, which is enabled or selected by actuating the first internal switch 122.

Once the first and second capacitors 114*a*, 114*b* have charged to a desired level, the IC 100 switches to a second, normal, mode of operation. The internal switch control circuitry 130 de-actuates (e.g switches off) the first internal switch 122 and actuates (e.g. switches on), the second internal switch 128 and the external switch 116, as shown in FIG. 6*b*. When the second internal switch 128 and the external switch 116 are actuated in this way, parallel current paths are provided for the total capacitance implemented by the combination of the first and second external capacitors 114*a*, 114*b*, with a first parallel path containing the second internal switch 128 and a second parallel path containing the external switch 116.

This application again permits current-controlled charging (or discharging) of the first and second external capacitors 114*a*, 114*b* in the first, initial or power-up mode of operation and independent control of the second internal switch 128 and the external switch 116 in the second, normal, mode of operation.

The fault detector circuitry 136 of the IC 100 may be configured to detect faults in the external switch 116 and/or in the external capacitors 114*a*, 114*b* in use of the IC 100 in the applications shown in FIGS. 6*a* and 6*b* and similar applications.

As will be appreciated by those of ordinary skill in the art, when the IC 100 is operating in its second, normal, mode in the applications shown in FIGS. 6*a* and 6*b* the second terminal of the first external capacitor 114*a* is coupled to the internal ground (or other reference voltage) terminal 110 of the IC 100 by the second internal switch 128. The comparator circuitry 132 thus does not "see" second terminal of the second external capacitor 114*b*, and thus the fault detection approach discussed above is not available for detecting faults in the external switch 116 in applications of the kind illustrated in FIGS. 6*a* and 6*b*.

To permit detection of faults in the external switch 116 in applications of the kind illustrated in FIGS. 6*a* and 6*b* (as well as other faults), the IC 100 may be configured to output a fault detection DC voltage Vfd (which may be a relatively small DC voltage, e.g. 0.3 V) to the capacitor coupling terminal 124 with the second internal switch 128 de-actuated (e.g. switched off) and monitor the voltage at the capacitor coupling terminal 124. If the monitored voltage at the capacitor coupling terminal 124 differs from an expected voltage, the IC 100 (e.g. the fault detector circuitry 136) may output a signal indicative of detection of a fault.

Figure 7A:
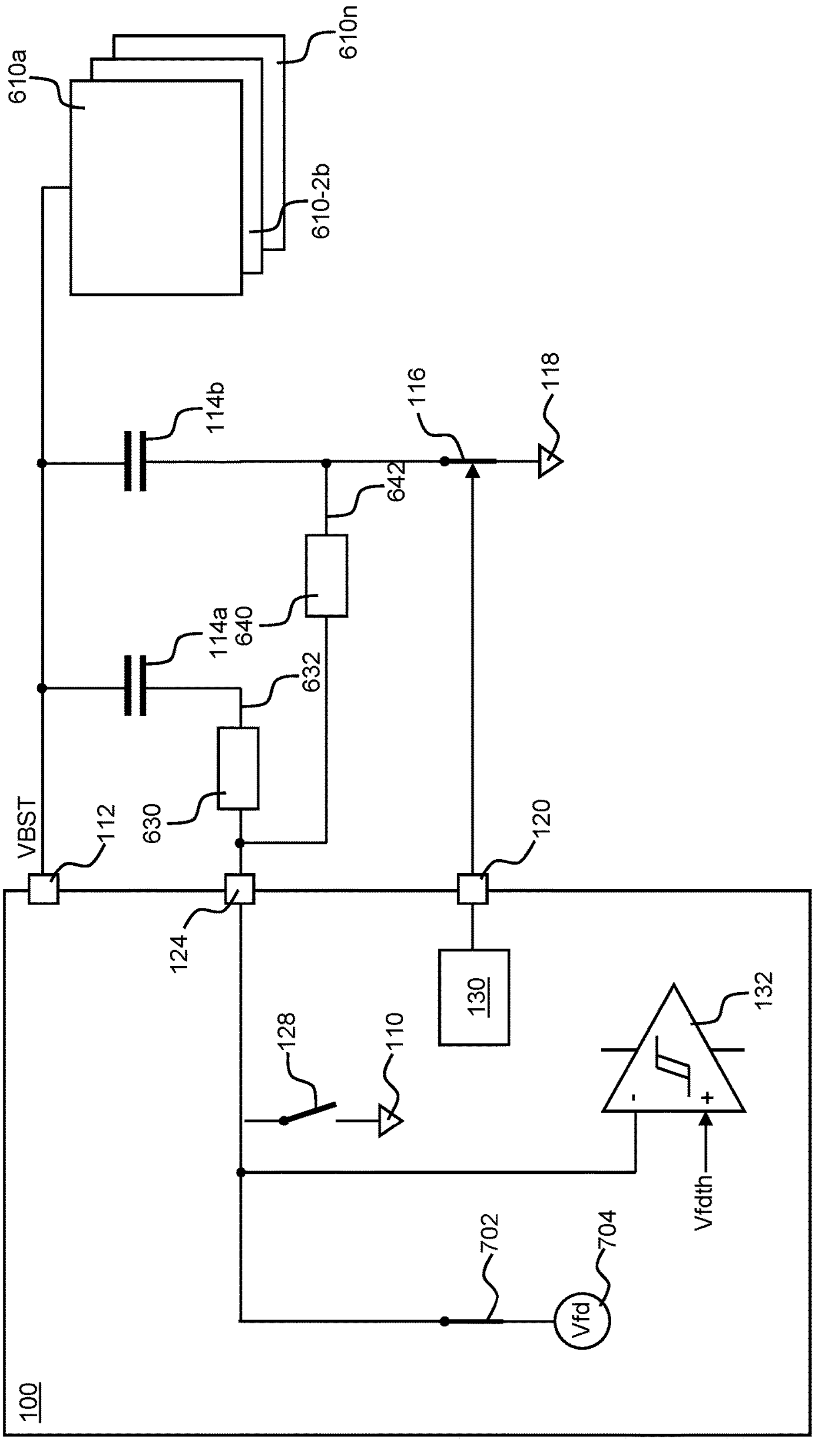
FIGS. 7*a* and 7*b* are schematic representations of fault detection arrangements for detecting faults in external switches that are coupled to the integrated circuit of any of FIGS. 1-4.

FIG. 7*a* is a schematic diagram illustrating an example arrangement for detecting a fault in an external capacitor or an external switch coupled to the capacitor coupling terminal 124 of the IC 100. For clarity, only those features of the IC 100 that are relevant to the described fault detection arrangement are shown in FIG. 7*a*. In the example shown in FIG. 7 the first external capacitor 114*a* is coupled to the capacitor coupling terminal 124 via a first resistor 630 and the second external capacitor 114*b* is coupled to the capacitor coupling terminal 124 via a second resistor 640, as in the application illustrated in FIG. 6*b*. However, it will be appreciated that the arrangement shown in FIG. 7*a* and described below is suitable for use in other applications of the IC 100.

In the illustrated example, the IC 100 comprises a fault detection switch 702 configured to selectively couple the capacitor coupling terminal 124 to a fault detection voltage source 704 that is configured to supply a fault detection voltage Vfd. As noted above, the fault detection voltage Vfd may be a relatively small DC voltage, e.g. of the order of 0.3 V. The fault detection switch 702 and the fault detection voltage source 704 may be provided as part of the fault detection circuitry 316, or may be provided elsewhere in the IC 100.

A fault detection check may be performed using the arrangement shown in FIG. 7*a* following a power-on reset of the IC 100, for example, when any external capacitor(s) 114*a*, 114*b* have charged up.

To perform a fault detection check using the arrangement shown in FIG. 7*a*, the internal switch control circuitry 126 outputs a control signal to de-actuate (e.g. switch off) the second internal switch 128 and the external switch control circuitry 134 outputs an external switch control signal SW2_Drive to actuate (e.g. switch on) the external switch 116.

A fault detection threshold voltage Vfdth is supplied to the non-inverting input of the comparator circuitry 132. The fault detection threshold voltage Vfdth is lower than the fault detection voltage Vfd (e.g. the fault detection threshold voltage Vfth may be of the order of 0.15 V if the fault detection voltage Vfd is of the order of 0.3 V).

The fault detection switch 702 is actuated (e.g. switched on) by the IC 100 to couple the fault detection voltage source 704 to the capacitor coupling terminal 124, thus supplying the fault detection voltage Vfd to the capacitor coupling terminal 124.

If the external switch 116 has actuated correctly in response to the external switch control signal SW2_Drive, the voltage at the capacitor coupling terminal 124 is equal to (or close to) Vfd. In this case the output of the comparator circuitry 132 is low, as the fault detection threshold voltage Vfdth at its non-inverting input is lower than the voltage at its inverting input. In response to this low output of the comparator 132, no signal indicative of detection of a fault is output by the IC 100.

If the external switch 116 has not actuated correctly in response to the external switch control signal SW2_Drive, e.g. because of a "stuck open" fault in the external switch 116, the capacitor coupling terminal 124 is coupled to the second terminals of the first and second external capacitors 124*a*, 124*b*. The on-resistance of the switch fault detection 702 and the parallel combination of the resistor 630 and 640 act as a voltage divider, such that the voltage at the capacitor coupling terminal node 124 is smaller than the fault detection voltage Vfd. In this case the output of the comparator circuitry 132 is high, as the fault detection threshold voltage Vfdth at its non-inverting input is higher than the voltage at its inverting input. In response to this low output of the comparator 132, a signal indicative of detection of a fault may be output by the IC 100.

Figure 7B:
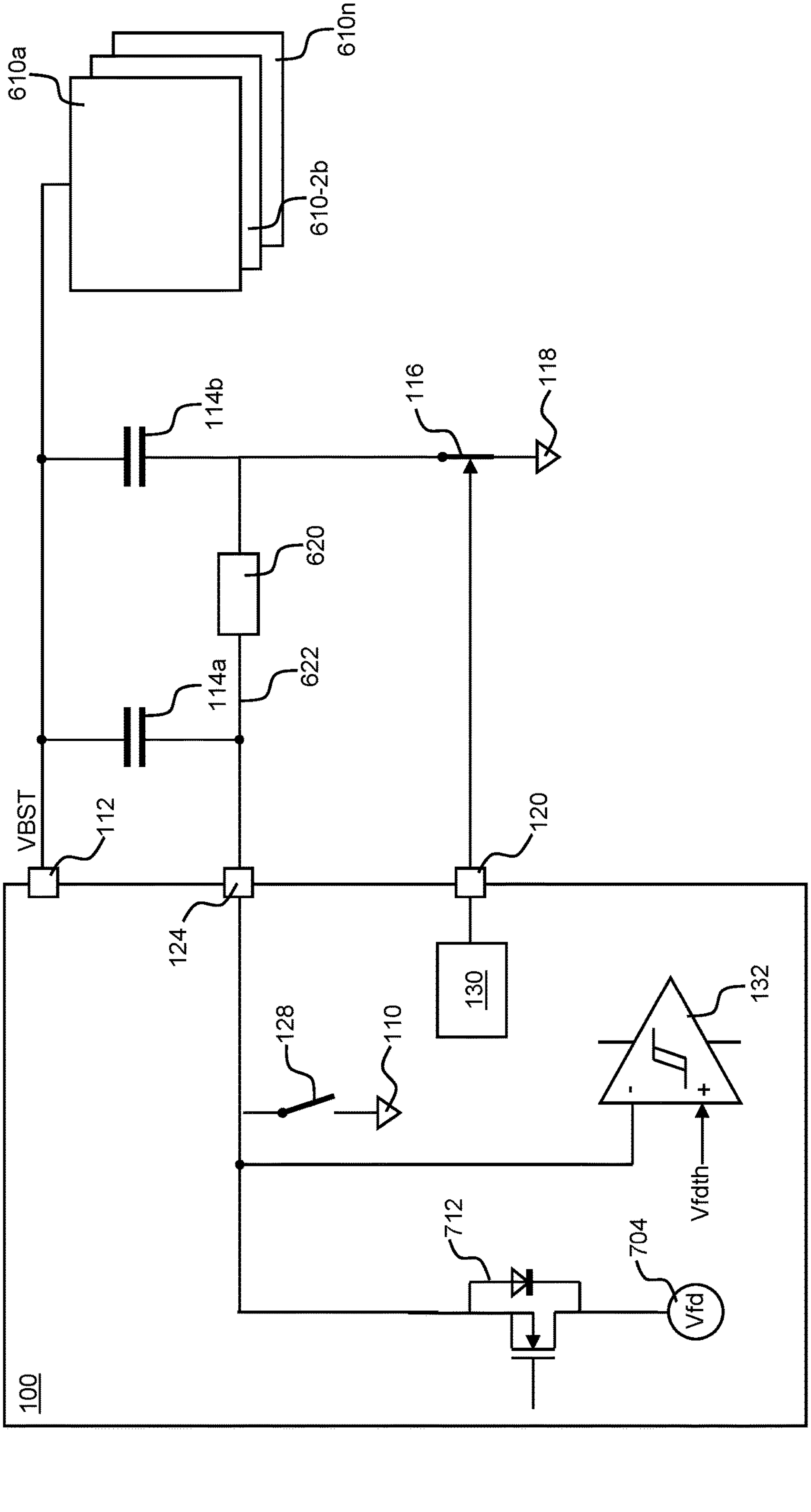

FIG. 7*b* is a schematic diagram illustrating another example arrangement for detecting a fault in an external capacitor or an external switch coupled to the capacitor coupling terminal 124 of the IC 100. Again, for clarity, only those features of the IC 100 that are relevant to the described fault detection arrangement are shown in FIG. 7. In the example shown in FIG. 7*b* the second terminal of the second external capacitor 114*b* is coupled to the second terminal of the first external capacitor 114*a* via a resistor 620, as in the application illustrated in FIG. 6*a*. However, it will be appreciated that the arrangement shown in FIG. 7*b* and described below is suitable for use in other applications of the IC 100.

The arrangement shown in FIG. 7*b* is similar to that of FIG. 7*a*, with the exception that the fault detection switch 702 of FIG. 7*a* is implemented in the arrangement of FIG. 7*b* by a MOSFET 712. The MOSFET 712 may be configured with any desired on-resistance. For example, the on-resistance of the MOSFET 712 may be the same as, or similar to, the resistance of the resistor 620. The MOSFET 712 and the fault detection voltage source 704 may be provided as part of the fault detection circuitry 316, or may be provided elsewhere in the IC 100.

To perform a fault detection check using the arrangement shown in FIG. 7*b*, the internal switch control circuitry 126 outputs a control signal to de-actuate (e.g. switch off) the second internal switch and the external switch control circuitry 134 outputs an external switch control signal SW2_Drive to actuate (e.g. switch on) the external switch 116.

A fault detection threshold voltage Vfdth is supplied to the non-inverting input of the comparator circuitry 132. The fault detection threshold voltage Vfdth is lower than the fault detection voltage Vfd (e.g. the fault detection threshold voltage Vfth may be of the order of 0.2 V if the fault detection voltage Vfd is of the order of 0.3 V).

The fault detection switch 702 is actuated (e.g. switched on) by the IC 100 to couple the fault detection voltage source 704 to the capacitor coupling terminal 124, thus supplying the fault detection voltage Vfd to the capacitor coupling terminal 124.

If the external switch 116 has actuated correctly in response to the external switch control signal SW2_Drive, the capacitor coupling terminal 124 is coupled to the external ground (or other reference voltage) rail 118 via the resistor 620. The on-resistance of the MOSFET 712 and the resistor 620 act as a voltage divider, such that the voltage at the capacitor coupling terminal 124 is smaller than the fault detection voltage Vfd. For example, if the on-resistance of the MOSFET 712 is equal to the resistance of the resistor 620, the voltage at the capacitor coupling node 624 is half the fault detection voltage, i.e. Vfd/2. In this case the output of the comparator circuitry 132 is high, as the fault detection threshold voltage Vfdth at its non-inverting input is higher than the voltage at its inverting input. In response to this high output of the comparator 132, no signal indicative of detection of a fault is output by the IC 100.

If the external switch 116 has not actuated correctly in response to the external switch control signal SW2_Drive, e.g. because of a "stuck open" fault in the external switch 116, the capacitor coupling terminal 124 is coupled to the second terminals of the first and second external capacitors 124*a*, 124*b*. Assuming that the first and second external capacitors 124*a*, 124*b* are fully charged (or close to fully charged), the voltage at the capacitor coupling terminal 124 is equal to or close to the fault detection voltage Vfd. In this case the output of the comparator circuitry 132 is low, as the fault detection threshold voltage Vfdth at its non-inverting input is lower than the voltage at its inverting input. In response to this high output of the comparator 132, a signal indicative of detection of a fault may be output by the IC 100.

In the examples described above with reference to FIGS. 7*a* and 7*b*, a fault detection threshold voltage Vfdth is supplied to the inverting input of the comparator circuitry 132 of the IC 100 when a fault detection check is being performed. In other examples, a separate fault detection comparator (not shown in FIGS. 7*a* and 7*b*) may be provided as part of the fault detection arrangements, configured and operative in the manner described above to compare the voltage at the capacitor coupling terminal 124 to a fault detection threshold voltage Vfdth to determine if there is a fault in the external switch 116.

Those of ordinary skill in the art will readily appreciate that one or more instances of a fault detection arrangement as described above and shown in FIG. 7*a* and/or one or more instances of a fault detection arrangement as described above and shown in FIG. 7*b* may be provided in the IC 200 of FIG. 2 or in the IC 300 of FIG. 3 or in the IC 400 of FIG. 4, to permit detection of a fault in the external switch(es) 116, 316*a*, 316*b*.

Although the specific examples described above with reference to FIGS. 1 and 2 relate to a power converter IC (specifically a boost converter IC), those skilled in the art will recognise that the principles of the present disclosure extend to ICs for other applications, e.g. buck converters, buck-boost converters, charge pumps, rectifiers, inverters, cell balancers and the like.

The present disclosure extends to a module for implementing a circuit, the module comprising a substrate or carrier such as a PCB on which are mounted an IC of the kind described above, an external switch and an energy storage device such as a capacitor or an inductor coupled to the IC and the external switch. The module may include further energy storage elements. For example, a module implementing a power converter circuit may comprise a power converter IC of the kind described above with reference to FIG. 1 or FIG. 2, an external switch and an external capacitor coupled in series between an output terminal of the IC and ground rail of the module, and an external inductor coupled to an input terminal of the IC, with the IC, external capacitor, external switch and external inductor being provided on a PCB or other substrate or carrier which is provided with suitable conductive elements (e.g. tracks or traces) for coupling the IC, to the external switch, capacitor and inductor to implement the power converter circuit.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An integrated circuit (IC) comprising:

control circuitry operable to control:

an external switch of a primary current path for an energy storage component of a circuit, wherein the external switch of the primary current path is external to the IC;

a first internal switch of a secondary current path for the energy storage component, wherein the first internal switch is internal to the IC, wherein the IC is selectively operable in either:

a first mode in which the first internal switch of the secondary current path is actuated to enable the secondary current path; or a second mode in which the external switch of the primary current path is actuated to enable the primary current path;

wherein:

the IC comprises a first output terminal and an energy storage component coupling terminal, wherein, in use of the IC, a first terminal of the energy storage component is coupled to the first output terminal and a second terminal of the energy storage component is coupled to the energy storage component coupling terminal and the external switch is coupled between the second terminal of the energy storage component and an external reference voltage terminal; and the first internal switch is coupled between the energy storage component coupling terminal of the IC and an internal reference voltage terminal of the IC, such that in use of the IC the first internal switch is coupled between the energy storage component and internal reference voltage terminal.

2. The IC of claim 1, wherein the first internal switch is configured to have a higher on-resistance than the external switch.

3. The IC of claim 2, wherein the first internal switch is physically smaller than the external switch.

4. The IC of claim 1, wherein an on-resistance of the first internal switch is controllable.

5. The IC of claim 1, further comprising a second internal switch of a tertiary current path for the energy storage component, wherein the second internal switch is internal to the IC.

6. The IC of claim 1, wherein the control circuitry is configured to control the external switch and the first internal switch based on signal indicative of a voltage at an energy storage component coupling terminal of the IC.

7. The IC of claim 6, wherein the control circuitry comprises comparator circuitry configured to compare the signal indicative of the voltage at the energy storage component coupling terminal to a signal indicative of a predefined threshold voltage and to selectively actuate the first internal switch and the external switch based on the comparison.

8. The IC of claim 7, wherein the control circuitry is configured to actuate the external switch to enable the primary current path when the voltage at the energy storage component coupling terminal falls below the predefined threshold voltage.

9. The IC of claim 8, further comprising fault detection circuitry configured to output a signal indicative of detection of a fault condition if the voltage at the energy storage component coupling terminal subsequently equals or exceeds the predefined threshold voltage.

10. The IC of claim 1, further comprising fault detection circuitry configured to compare an actual charging or discharging profile of the energy storage component to an expected charging or discharging profile of the energy storage component to identify the existence of a fault condition.

11. The IC of claim 10, wherein the fault detection circuitry is configured to output a signal indicative of detection of the fault condition if a time taken for a voltage at an energy storage component coupling terminal of the IC to reach a predefined threshold voltage does not correspond to an expected time for the voltage at the energy storage component coupling terminal to reach the predefined threshold voltage.

12. The IC of claim 1, wherein the IC is configured to output a fault detection voltage to an energy storage component coupling terminal of the IC and to monitor a voltage at the energy storage component coupling terminal to detect a fault in the external switch.

13. The IC of claim 12, wherein the IC comprises a fault detection voltage source and a fault detection switch configured to selectively couple the fault detection voltage source to the energy storage component coupling terminal.

14. The IC of claim 12, wherein the IC is configured to compare the monitored voltage at the energy storage component coupling terminal to a fault detection voltage threshold voltage and to output a signal indicative of detection of a fault condition if the monitored voltage at the energy storage component coupling terminal is greater than the fault detection voltage threshold voltage.

15. The IC of claim 14, wherein the IC comprises a comparator for comparing the monitored voltage at the energy storage component coupling terminal to the fault detection voltage threshold voltage.

16. The IC of claim 13, wherein the fault detection switch comprises a MOSFET.

17. The IC of claim 1, wherein:

the IC comprises a first output terminal and an energy storage component coupling terminal, wherein, in use of the IC, a first terminal of the energy storage component is coupled to the first output terminal and a second terminal of the energy storage component is coupled to the energy storage component coupling terminal and the external switch is coupled between the second terminal of the energy storage component and an external reference voltage terminal; and the first internal switch is coupled between an energy storage component coupling terminal of the IC and an internal reference voltage terminal of the IC, such that in use of the IC the first internal switch is coupled between the energy storage component and internal reference voltage terminal.

18. The IC of claim 5, wherein the second internal switch is coupled between an energy storage component coupling terminal of the IC and an internal reference voltage terminal of the IC, such that in use of the IC the second internal switch is coupled between the energy storage component and internal reference voltage terminal.

19. The IC of claim 1, further comprising:

second control circuitry operable to control:

a second external switch of a primary current path for a second energy storage component of a circuit, wherein the external switch of the primary current path for the second energy storage component is external to the IC;

a third internal switch of a secondary current path for the second energy storage component, wherein the second internal switch is internal to the IC.

20. The IC of claim 19, further comprising a fourth internal switch of a tertiary current path for the second energy storage component, wherein the fourth internal switch is internal to the IC.

21. The IC of claim 1, wherein the energy storage component comprises a capacitor or an inductor.

22. The IC of claim 1, wherein the IC comprises:

a power converter IC;
a boost converter IC;
a buck converter IC;
a buck-boost converter IC;
a charge pump IC;
a rectifier IC;
an inverter IC; or
a cell balancing IC.

23. A module comprising:

the integrated circuit of claim 1;
the external switch; and
an energy storage component coupled to the integrated circuit and the external switch.

24. A host device comprising the integrated circuit of claim 1.

25. The host device of claim 24, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

26. The IC of claim 1, wherein:

in operation of the IC in the first mode, the first internal switch of the secondary current path is actuated to enable the secondary current path and the external switch of the primary current path is de-actuated to disable the primary current path; and in operation of the IC in the second mode, the external switch of the primary current path is actuated to enable the primary current path and the first internal switch of the secondary current path is de-actuated to disable the secondary current path.

27. An integrated circuit (IC) comprising:

first control circuitry operable to control:

an external switch of a primary current path for an energy storage component of a circuit, wherein the external switch of the primary current path is external to the IC; and a first internal switch of a secondary current path for the energy storage component, wherein the first internal switch is internal to the IC;

wherein the IC is selectively operable in either:

a first mode in which the first internal switch of the secondary current path is actuated to enable the secondary current path; or a second mode in which the external switch of the primary current path is actuated to enable the primary current path;

wherein the IC further comprises:

second control circuitry operable to control:

a second external switch of a primary current path for a second energy storage component of a circuit, wherein the external switch of the primary current path for the second energy storage component is external to the IC; and a second internal switch of a secondary current path for the second energy storage component, wherein the second internal switch is internal to the IC.

* * * * *